United States Patent [19]

Smith

[11] Patent Number: 4,857,898
[45] Date of Patent: Aug. 15, 1989

[54] DATA COMPRESSION TECHNIQUE FOR RECONFIGURABLE REMOTE CONTROL APPARATUS

[75] Inventor: Bobby J. Smith, Knoxville, Tenn.

[73] Assignee: North American Philips Consumer Electronics Corp., Knoxville, Tenn.

[21] Appl. No.: 130,818

[22] Filed: Dec. 9, 1987

[51] Int. Cl.$^4$ .................. H04Q 9/14; G08C 19/00
[52] U.S. Cl. ..................... 341/22; 340/825.69; 341/175; 341/176
[58] Field of Search ............. 340/696, 825.57, 825.69, 340/825.72; 455/603, 608; 358/194.1; 365/189

[56] References Cited

U.S. PATENT DOCUMENTS

| | | | |
|---|---|---|---|
| 4,581,633 | 4/1986 | Hobbs | 358/107 |
| 4,598,411 | 7/1986 | Berkovich et al. | 375/27 |
| 4,623,887 | 11/1986 | Welles, II | 340/825.57 |
| 4,626,848 | 12/1986 | Ehlers | 340/825.69 |
| 4,700,294 | 10/1987 | Haynes | 364/200 |

*Primary Examiner*—Glen R. Swann, III
*Assistant Examiner*—Thomas J. Mullen, Jr.
*Attorney, Agent, or Firm*—Marianne R. Rich

[57] ABSTRACT

A method for compressing formatted code is disclosed. According to the method, the code is scanned so that all different burst and pause lengths of the code are found. The lengths are then arranged as elements of an array, with each element having a representative element number. Then, the formatted code is scanned for all possible burst-pause length couples found together. Using the "couple" information as well as the element numbers of the first array, a second array is provided with each element having two nibbles. Both nibbles of the second array element are used to point to an element number of the first array. Finally, a third array which represents the compressed formatted code is generated. The third array is also formed with elements having two nibbles. However, the nibbles of the third array point to the second array element numbers and can properly represent the entire formatted code therewith. Preferably, the formatted code is further comrpessed by recognizing repeat code of the repeat of an entire key code in the formatted code. Indications that an entire key code or just a particular repeat code are to be repeated after the full key code is completed may be stored in another array. Thus, repeat information need not be included in the compressed third array.

14 Claims, 14 Drawing Sheets

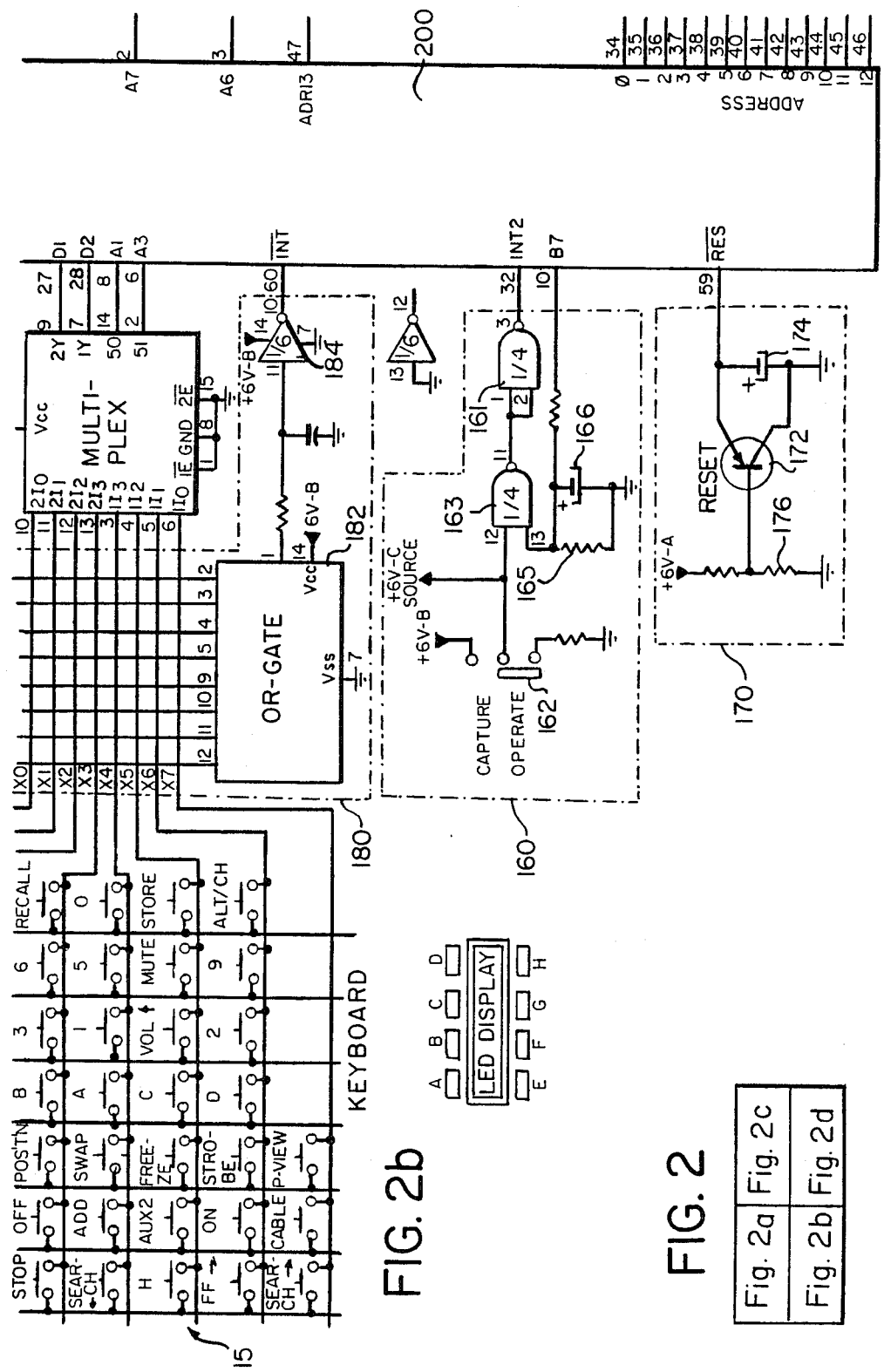

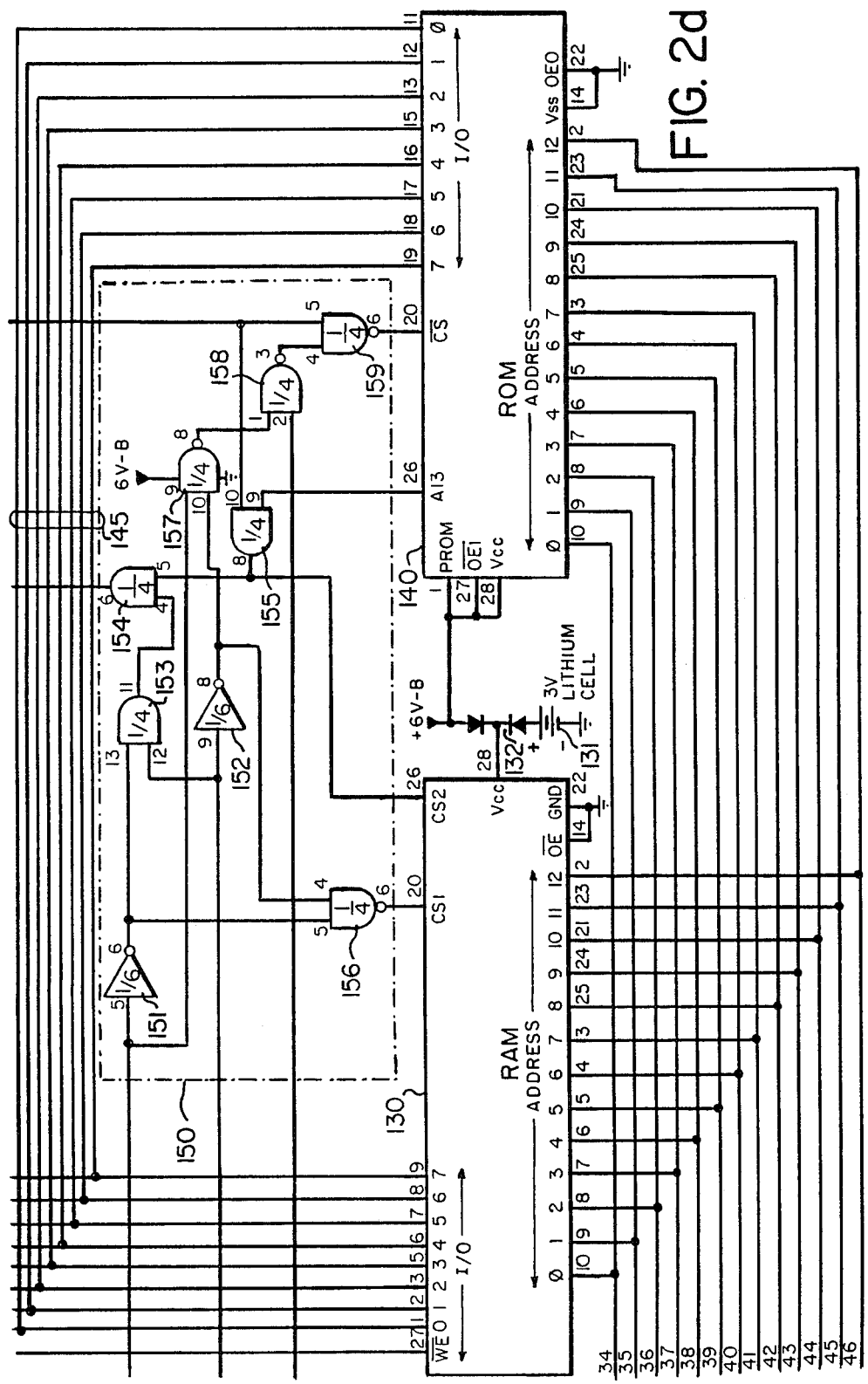

SYSTEM FLOWCHART

CAPTURE MODULE FLOWCHART

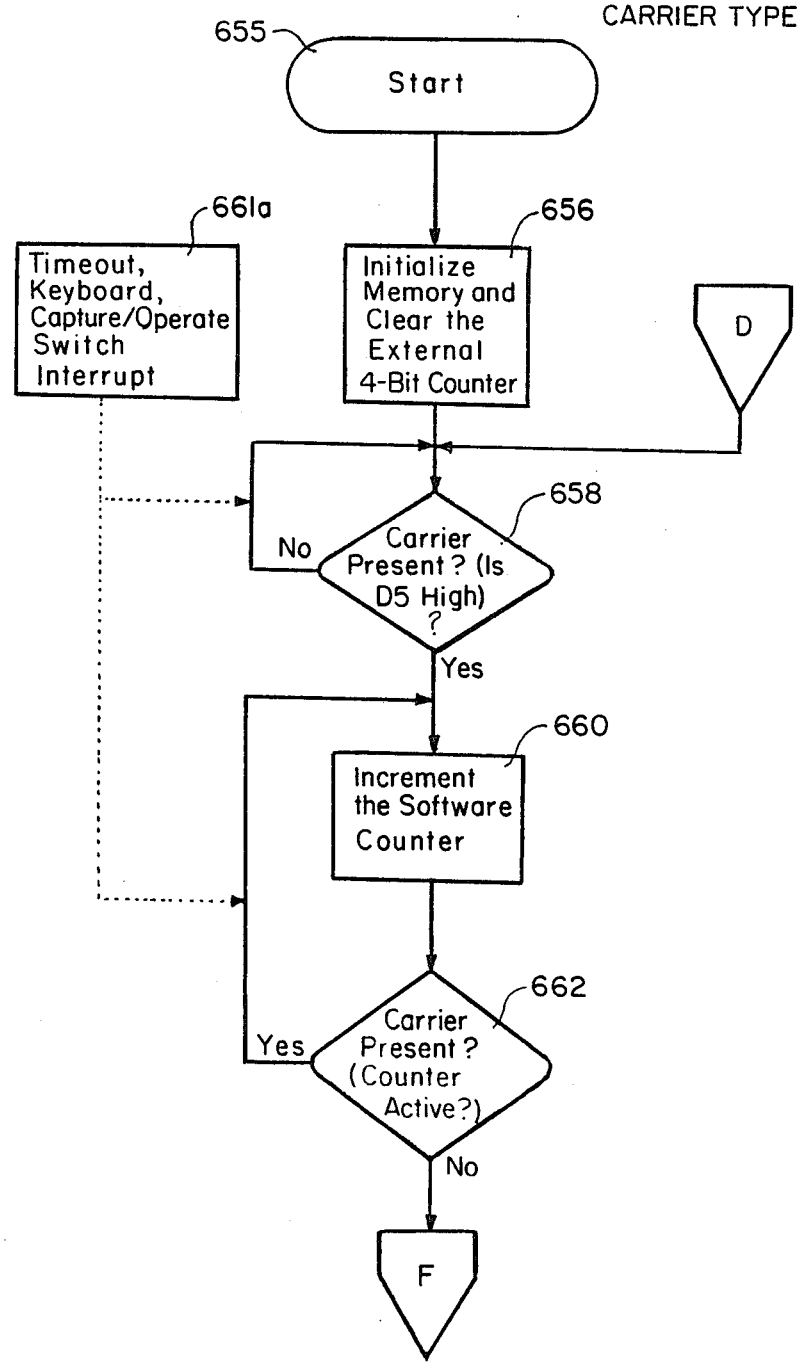
FIG. 6a — CODE CAPTURE ALGORITHM FOR CARRIER TYPE CODES

CODE CAPTURE ALGORITHM FOR NON-CARRIER TYPE CODES

FIG. 8

```
                          ELEMENT NOS.
              0  1  2  3  4  5  6   ┌─840
23E0  FF FF 00 C8 00 65 00 0C 00 24 03 8B 00 31 08 8B   .......$...1..  ←── ARRAY D
23F0  FF FF FF FF FF FF FF FF FF FF FF FF FF FF FF FF   ..............

0  1  2  3  4  5   ┌─830
25D0  FF FF FF FF FF FF FF 01 22 23 24 05 26 FF FF FF   ........"$$.&...  ←── ARRAY C
25E0  FF FF FF FF FF FF FF FF FF FF FF FF FF FF FF FF   ................

0 1 2 3 4 5 6 7 8  ┌─820
2670  FF FF FF FF FF FF FF 01 11 11 22 12 22 22 11 21   ..........'."'.!  ←── ARRAY B
2680  21 21 11 12 12 12 22 23 45 00 00 00 00 00 00 00   ''....'$E.......
      9 A B C D E F G H
                                                ┌─810
     ┌─────────────────────────────────────────────┐
2000 │00 C8 00 65 00 0C 00 0C 00 0C 00 0C 00 0C 00 0C│  ..............  ←── ARRAY A
2010 │00 0C 00 0C 00 0C 00 0C 00 0C 00 24 00 0C 00 24│  ...........$...$
2020 │00 0C 00 0C 00 0C 00 24 00 0C 00 24 00 0C 00 24│  .......$...$...$
2030 │00 0C 00 24 00 0C 00 24 00 0C 00 0C 00 0C 00 0C│  ...$...$........
2040 │00 0C 00 24 00 0C 00 0C 00 0C 00 24 00 0C 00 0C│  ...$.......$....
2050 │00 0C 00 24 00 0C 00 0C 00 0C 00 0C 00 0C 00 0C│  ...$............
2060 │00 0C 00 0C 00 0C 00 24 00 0C 00 0C 00 0C 00 24│  .......$.......$
2070 │00 0C 00 0C 00 0C 00 24 00 0C 00 24 00 0C 00 24│  .......$...$...$
2080 │00 0C 00 24 00 0C 03 8B│00 C8 00 31 00 0C 08 8B   ...$.......1....   MIN. DATA
     └───────────────────────┘                                            FOR CODE
2090  00 C8 00 31 00 0C 08 8B 00 C8 00 31 00 0C 08 8B   ...1.......1....   REGENERATION
20A0  00 C8 00 31 00 0C 08 8B 00 C8 00 31 00 0C 08 8B   ...1.......1....
20B0  00 C8 00 31 00 0C 08 8B 00 C8 00 31 00 0C 08 8B   ...1.......1....
20C0  00 C8 00 31 00 0C 08 8B 00 C8 00 31 00 0C 08 8B   ...1.......1....
20D0  00 C8 00 31 00 0C 08 8B 00 C8 00 31 00 0C 08 8B   ...1.......1....   REPEAT
20E0  00 C8 00 31 00 0C 08 8B 00 C8 00 31 00 0C 08 8B   ...1.......1....   DATA
20F0  00 C8 00 31 00 0C 08 8B 00 C8 00 31 00 0C 08 8B   ...1.......1....
       ADDRESS                DATA
```

DATA COMPRESSION TECHNIQUE FOR RECONFIGURABLE REMOTE CONTROL APPARATUS

The instant application is related to RECONFIGURABLE REMOTE CONTROL APPARATUS AND METHOD OF USING THE SAME filed concurrently herewith by the same inventor and assigned to the same assignee. Assignee's identificaiton number is PHA 40-523.

BACKGROUND OF THE INVENTION

The present invention generally relates to data compression techniques. More particularly, the present invention relates to a compression technique for compressing formatted code obtained from a remote control apparatus of a consumer product by a reconfigurable remote control apparatus which can emulate any one of a plurality of transmitters for consumer products such as televisions, video cassette recorders and the like.

Many consumer electronic products such as televisions, video cassette recorders, video disc players, etc. are equipped with hand held infrared remote control transmitters. Each consumer product typically requires its own remote control transmitter due to the fact that the hardware of the electronic product is arranged to accept particular frequencies and codes only. Thus, while the convenience of remote control is well appreciated, confusion often results due to the proliferation of such remote control units. It is therefore desirable to provide a single remote control transmitter for controlling each of several electronic products.

Those skilled in the art will recognize that remote control transmitters provide a code for each key available on the transmitter. In providing a reconfigurable remote control transmitter which can capture the codes of different transmitter, the reconfigurable remote control transmitter must be provided with ample storage for code data. Because of the number of keys on each transmitter and the number of consumer products which are remotely controllable, the data storage requirements would impose a serious burden if the code data were not compressed. Therefore, compression techniques which are capable of substantially compressing obtained code are greatly advantageous.

SUMMARY OF THE INVENTION

It is therefore an object of the invention to provide a method for substantially compressing formatted code obtained from a remote control means such that the code may be easily expanded to regenerate a substantially identical signal as to what was obtained.

It is a further object of the invention to provide a method for substantially compressing formatted code obtained from a remote control means wherein the obtained formatted code may represent pulses separated by pauses or signal bursts at a particular frequency separated by pauses.

In accord with the objects of the invention, the method for compressing formatted code preferably comprises determining all different burst and pause lengths and arranging the lengths as elements of an array, with each element having a representative element number. Then, the formatted code is scanned for all possible burst-pause length couples found together, and using the "couple" information as well as the element numbers of the first array, a second array is provided with each element having two nibbles. Both nibbles of the second array element are used to point to an element number of the first array. Finally, a third array which represents the compressed formatted code is generated. The third array is also formed with elements having two nibbles. However, the nibbles of the third array point to the second array element numbers and can properly represent the entire formatted code therewith.

Preferably, the formatted code is further compressed by recognizing repeat code or the repeat of an entire key code in the formatted code. Indications that an entire key code or just a particular repeat code are to be repeated after the full key code is completed may be stored in another array. Thus, repeat information need not be included in the compressed third array.

Also, in accord with the invention, a reconfigurable remote control apparatus is provided for use with a plurality of remotely controllable products at least one of which is responsive to signals of a different transmission protocol than another. The provided reconfigurable remote control apparatus generally comprises:

(a) receiver means for receiving during a capture mode signals transmitted from a remote control transmitter to be emulated, said signals comprising first protocol signals having pulses separated by pauses, and second protocol signals having bursts of pulses at a carrier frequency separated by pauses;

(b) distinguishing means connected to said receiver means for distinguishing between said first protocol signals and said second protocol signals and for providing an indication of the protocol used by each transmitter to be emulated;

(c) memory means;

(d) processing means connected to said receiver means for substantially determining at least the duration of said pauses and providing to said memory means first data representative thereof when said first protocol signals are received, and for substantially determining the carrier frequency and the duration of said pulse burst and pauses between pulse bursts and providing second data representative thereof when said second protocol signals are received;

(e) transmitter means for transmitting control signals corresponding to transmitter input signals applied thereto;

(g) user operable selector means for controlling said reconfigurable remote control apparatus; and (h) transmitter control means connected to said memory means and said user operable selector means, for addressing said memory means in response to user activation of said selector means and causing data stored in said memory means to be sent to said transmitter means to constitute said transmitter input signals.

Preferably, a microprocessor is provided to at least partially accomplish the functions of the distinguishing means, the processing means, and the transmitter control means. The microprocessor is also preferably arranged to conduct a data compression of the received code according to a preferred data compression technique. Also, the reconfigurable apparatus preferably includes a prompting means which is coupled to and controlled by the microprocessor. The prompting means is for prompting a user to initiate transmission of a signal from a remote control transmitter to be emulated. The prompting means preferably includes a dot matrix liquid crystal display (LCD) which displays characters in a reverse and upside-down orientation when the transmitter is put head to head with the transmitter whose code is to be captured, and in a normal orientation when the transmitter is normally operated. Also, the microprocessor of the reconfigurable remote control apparatus is programmed to cause the prompting means to prompt the user to press the keys of the transmitter to be captured in a predetermined sequence and without pressing the corresponding keys of the reconfigurable apparatus. If the code of many of the keys have already been captured, the user may advance quickly through the predetermined sequence without pressing the already captured key codes, by pressing a key of the reconfigurable apparatus which will scan forward through the prompting instructions. A scan back key is also preferably provided.

It will be recognized that the method invention is closely connected with the reconfigurable remote control apparatus invention and particularly requires that the type of remote to be captured (i.e. pulse type, or carrier frequency type) be determined prior to capturing the codes for each key of the transmitter. The type of remote is preferably determined by timing the cycles of the signals from the remote transmitter as it has been found that at least seven cycles of a carrier pulse will always occur within 350 microseconds, but that seven non-carrier pulse cycles will never appear within 350 microseconds. Once the type of signalling of the remote transmitter to be captured is determined, the capture of each key code may proceed. Each key of the remote to be captured is then pressed only once and in a predetermined order with prompts appearing on the LCD display. Because of the manner of prompting, it is not necessary to press the corresponding keys of the capturing device.

A better understanding of the invention, and additional advantages and objects of the invention will become apparent to those skilled in the art upon reference to the detailed description an the accompanying drawings.

BRIEF DESCRIPTION OF THE DRAWINGS

FIGS. 6a–6c are flow diagrams representing the carrier frequency code capture module of FIG. 4;

FIG. 8 shows a set of arrays which are useful for understanding the data compression technique used by the remote control apparatus of FIG. 1.

DETAILED DESCRIPTION OF THE PREFERRED EMBODIMENT

Figure 1:
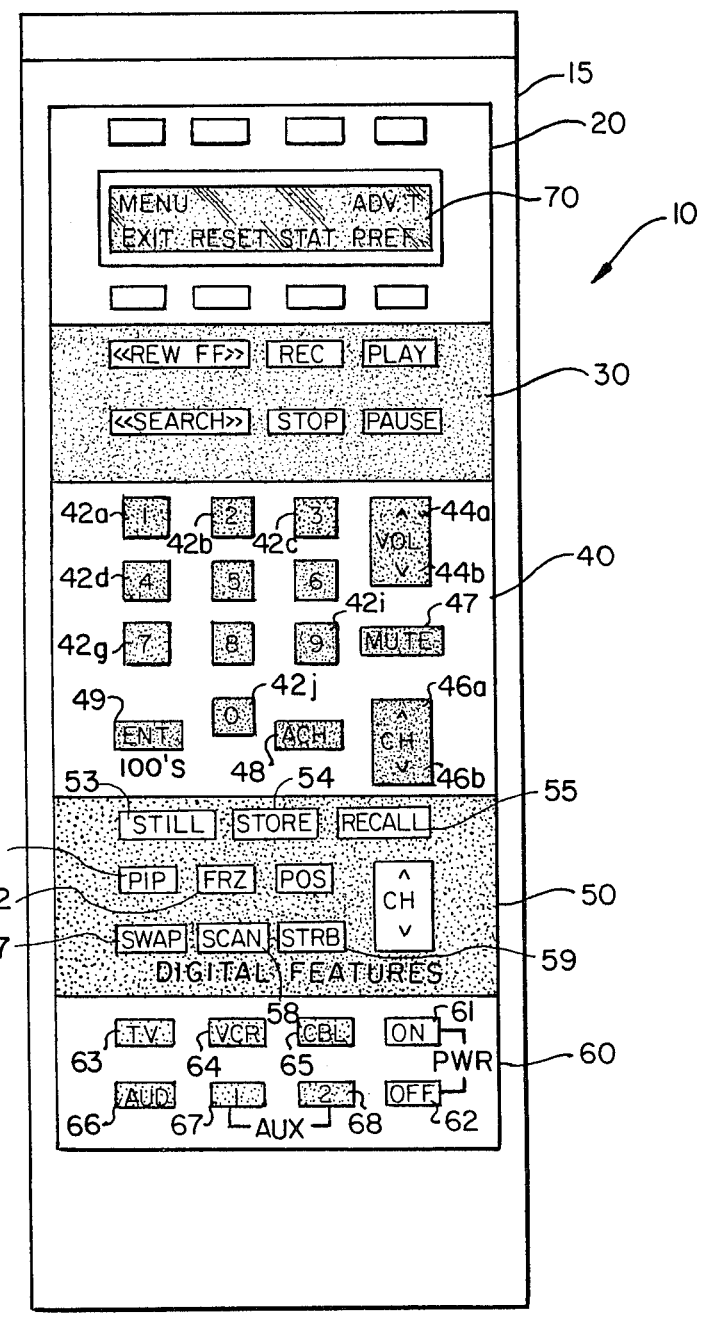
FIG. 1 is a plan view of the reconfigurable remote control apparatus according to a preferred embodiment of the invention.

Turning to FIG. 1, a user's view of the reconfigurable remote control apparatus 10 is seen. As will be described in detail hereinafter, the remote control apparatus 10 is operated in two major modes. A first mode permits a user to capture the codes of remotely controllable products from their remote control transmitters. The code is then compressed and stored. A second mode permits the user to control and operate a plurality of remotely controllable consumer products whose code has been captured (or is known and available in preprogrammed memory) by expanding the stored code for the particular product and transmitting the same. Thus as seen in FIG. 1, remote control apparatus 10 includes a user keyboard 15 (with associated circuitry shown in FIG. 2) having five sets of keys or buttons 20, 30, 40, 50, and 60, and a dot matrix liquid crystal display 70 to help accomplish the capture of remote control codes of electronic products and thereafter to control and operate those products. The keyboard 15 is preferably a rubber pad type in a seven by eight matrix format. While fifty-six keys would be permitted, only fifty-two are defined in the preferred embodiment.

A first set of keys 20 are "soft keys" which are defined by the apparatus 10 as required according to the particular software module which is being used. The dot matrix LCD 70 is instrumental in permitting the eight soft keys 20 to change their meaning as a soft key menu is shown on the dot matrix LCD 70. The particular functions of the soft keys will be described hereinafter in greater detail.

The second set of keys 30 will be recognized by those skilled in the art as being dedicated video cassette recorder issue commands to either the main VCR or to a second VCR if such a unit is selected as described hereinafter as being a unit to be captured. The second set of keys 30 are active regardless of the LCD menu.

The third set of keys 40 is a set which is common to television, VCR, as well as cable TV, audio systems, etc. The seventeen keys which comprise the third set 40 include the decimal numbers 42a–42j as well as a volume controls 44a, 44b (up and down), channel controls 46a, 46b (up and down), a mute control 47, an alternate channel control 48, and an enter control 49. These keys are critical to the control of most electronic products.

The eleven digital feature keys which comprise the fourth set of keys 50 are used for issuing commands to the main TV only and are active regardless of the LCD menu. These keys control digital feature functions such as: picture-in-picture (PIP) 51; freezing 52 of the PIP picture; freezing of the main picture 53 (STILL); storage 54; recalling 55 of the stored main picture; repositioning 56 of the PIP picture; swapping 57 of the main and PIP pictures; channel scanning 58; and sequential picture strobe 59.

Finally, the fifth set of keys 60 are the system and power keys to turn the unit on and off and to indicate which of the products is to be operated or captured. The system keys 63–68, in essence, redirect power keys 61–62, key set 40, and the soft keys 20. The power keys include a power on key 61 and a power off key 62. The system TV key 63 is reserved for operating the main TV. Likewise, the VCR key 64 is reserved for operating or capturing the main VCR. Further the CBL key 65 is reserved for a cable system, while key 66 is reserved for an audio system. The audio system may be a remote amplifier, tuner, compact disk player, or tape player as chosen by prompting which will be described hereinafter. Auxiliary keys 67 and 68 are provided for auxiliary systems such as a second TV, second VCR, second cable, video disk, or satellite receiver, as desired by the user. Those skilled in the art will recognize that additional products could be permitted to be programmed on the auxiliary keys 66 and 67 if desired. Indeed, additional keys could be provided for additional systems beyond the six permitted according to the shown embodiment, provided of course, that enough memory is provided for storage of the obtained information.

As indicated in FIG. 2, apparatus 10 includes much more than just a keyboard ("user operable selector means") 15 and a LCD display 70. The apparatus 10 preferably also includes an infrared receiver ("receiver means") 110, capture logic 120, an 8K by 8 RAM 130 and a 16K by 8 ROM 140 (both comprising "memory means"), bank select and address decode logic 150, capture/operate selection logic 160, power up reset circuitry 170, keyboard interrupt logic 180, operate wakeup logic 190, a microprocessor 200, power and clock section 210, and an infrared transmitter ("transmitter means") 220.

Before discussing the circuitry of apparatus 10 in detail, it will be appreciated that the provided circuitry performs various functions. Thus, a first function is to determine whether the signals being transmitted from a remote control transmitter to be emulated (not shown) is comprised of pulses separated by pauses or whether the signals are comprised of bursts of pulses at a carrier frequency separated by pauses. In order to do the same, "distinguishing means" comprised of the capture logic 120, the microprocessor 200, and the clocking means of power and clock section 210 cooperate in a manner which will be discussed below. If it is determined that the received signals are of the non-carrier-type protocol (pulses separated by pauses), a second function of the circuitry is to determine the pause length between each pulse. This function is accomplished by "processing means" which is basically comprised of the microprocessor 200 and its associated clocking section 210. If it is determined that the received signals are of the carrier-type protocol, the "processing means" (which may further include capture logic 120) has the function of determining the carrier frequency as well as timing the duration of the pulse burst and pauses. Further, based on the determination of the type of signal being received as well as the timing of that signal, the "processing means" is arranged to perform a function of taking the information and sending it to RAM ("memory means") or storage. Of course, before storing, the received information, is preferably reduced (i.e. compressed). Thus, a "compression means" which is comprised of the processing and internal memory sections of the microprocessor 200 as well as the associated ROM 140 which contains control software for the microprocessor is used to conduct such a compression scheme according to a preferred data compression technique discussed hereinafter. Once the information is stored in a compressed format in RAM it is available for selection via the keyboard and expansion by the "transmitter control means" which is comprised of at least the microprocessor. The expanded code may then be sent to the transmitter means such that the transmitter means may send it according to the protocol acceptable to a remote device which is to be operated.

With regard to apparatus 10, it should further be appreciated that the circuitry further provides a prompting function for helping the user to step through the capture (programming) sequence. Thus a "prompting means" is provided and basically comprises the microprocessor 200 and its associated ROM 140. The "prompting means" provides the information which directs the user in an expedited manner how to capture the code of another remote control device. The actual display of the information provided by the prompting means can be on the LCD display 70 of the apparatus 10 itself. If desired, however, the information provided by the prompting means can be sent to and shown by a television (not shown) under the control of the apparatus 10.

Figure 2A:
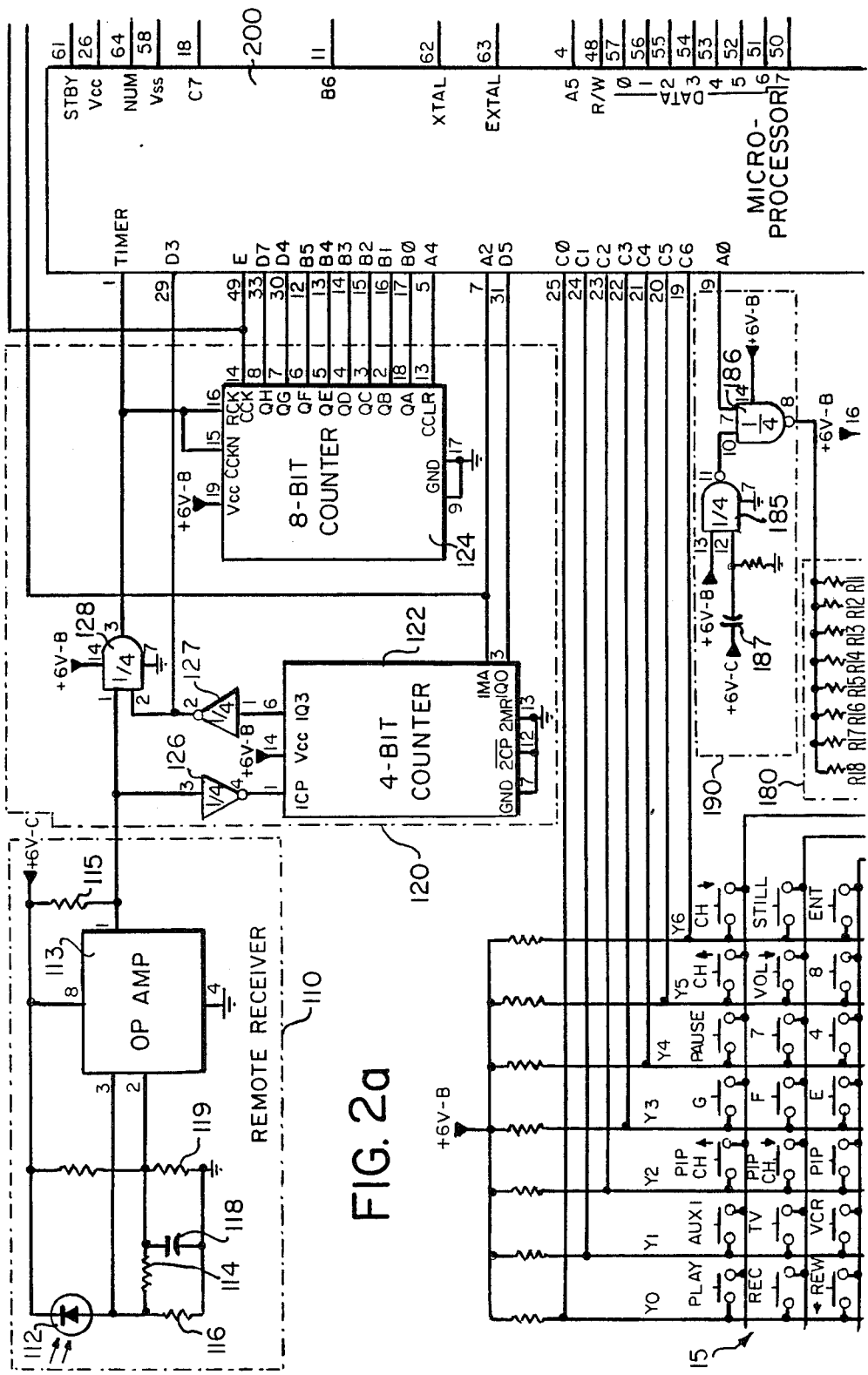
FIG. 2 which as shown in box format comprises FIGS. 2a–2d which together constitute a block diagram of the preferred reconfigurable remote control apparatus.

Turning to FIG. 2, and particularly to FIG. 2a, the circuitry for capturing the control code of another remote control apparatus is seen. An infrared receiver means 110 includes a light-activated diode 112 which has its anode connected to a first input of comparator (op amp) 113, and its cathode connected to a six volt voltage source. The anode of diode 112 is also connected to another input of comparator 113 via resistor 114. With the provided arrangement, including resistors 115, 116 and 117, and capacitor 118, the comparator 113 produces a digital (zero to five volt) signal that follows the incoming infra-red signal. Thus, the receiver means 110 compares the reference voltage applied to its pin 2 with the voltage applied to pin 3. The voltage at pin 3 varies as current flows through the diode 112 upon receipt of an infra-red signal. When a differential voltage occurs between pins 3 and 2, the output of comparator 113 switches high and low accordingly. Resistor 115 acts as a pull-up for the open-collector output of the comparator 113. Thus, the output voltage of infrared receiver 110 goes high in accord with the signal received by diode 112, and the voltage is properly scaled (digitally) by the circuitry such that the capture logic circuitry 120 and microprocessor 200 can make proper determinations.

The output of infrared receiver means 110 is received by the capture logic circuitry which basically comprises a four bit counter 122, an eight bit counter 124, inverters 126 and 127, and AND gate 128. The function of four bit counter 122 is primarily to count the output voltage cycles of receiver means 110, and the four bit counter is connected to the output of receiver means 110 via inverter 126. The function of eight bit counter 124 is primarily to measure the time period that the output from the receiver means 110 is low, and eight bit counter 124 is connected to the output of receiver means 110 via AND gate 128. The internal timer/counter of the microprocessor 200 is used together with the counters 122 and 124 and determines the length of time the output of the receiver means 110 is high. Microprocessor 200 is connected to the output of receiver means 110 via AND gate 128, to counter 122 via inverter 127, and to eight bit counter 124 via direct lines.

In operation, as will be described hereinafter in greater detail, a determination of the signal type is made by arranging the apparatus 10 and the remote control device to be emulated "head to head" and by pressing any key of the remote control device to be emulated. In the capturing mode where signal type (e.g., pulses and pauses, or bursts at a carrier frequency) is being determined, counters 122, 124, and the internal counter of microprocessor 200 are utilized. The output of AND gate 128 will be low when no signal is received by the receiver means 110, and therefore the CCKN and RCK inputs of the counter 124 go low thus enabling the counter which will increment. Also, with the output of AND gate 128 low, the timer pin of the microprocessor will be brought low thereby disabling the internal counter clock. Upon receipt of an IR waveform, the output of receiver means 110 goes high thereby causing output IQO of the four bit counter 122 to go high. Because input D5 of the microprocessor 200 monitors output IQO of the four bit counter 122, upon the low to high transition of output IQO, the microprocessor reads the count of eight bit counter 124. In order for the count of counter 124 to be read, the count of the counter is latched to outputs QA-QH by the rising edge of the RCK input to the counter.

It will be appreciated that as the IR waveform represented by the digital output of receiver 110 goes high and low, the clocks of the eight bit counter 124 and the internal counter of microprocessor 200 are alternately activated. Simultaneously, the four bit counter 122 is incrementing each time a cycle (e.g. rising edge to rising edge) is completed. In the preferred embodiment of the invention, if seven full cycles of the IR waveform are received within three hundred and fifty microseconds after the first high signal, the IQ3 output of counter 122 goes high, and the captured IR waveform is recognized as a carrier-type. However, if seven full cycles of the IR waveform are not received in the allotted time, the IR waveform is identified as a non-carrier type (i.e. pulse-type). In this case, the counters are all reset.

Where the received waveform is a carrier-type, and the IQ3 output of counter 122 goes high, inverter 127 inverts the IQ3 output of counter 122, and AND gate 128 is forced low. With one input into AND gate 128 being low, the output of receiver 110 is no longer gated through to either the eight bit counter 124 nor to the internal counter of the microprocessor. At this point in time, the final count of the eight bit counter 124 is latched onto its output pins QA-QH as the RCK input into the counter 124 is quickly pulsed due to gate delays of the inverter 126 and the four bit counter 122.

As indicated in FIG. 2a, the input D3 to when the output of inverter 127 goes low, the microprocessor 200 is informed that seven complete cycles of the input signal have been received. The microprocessor then compares the starting and ending values (counts) for the eight bit counter 124 and saves that count, reads the value of the internal counter and saves that count, and then resets all the counters. The value stored for the microprocessor counter is seen to represent the amount of time (in microseconds) that the received signal was high, while the difference of the values for the counter 124 represents the length of time the signal was low. By adding the high and low time and dividing by seven, the microprocessor determines the carrier frequency.

Before turning to the manner of capturing the carrier-type and pulse-type codes, it should be appreciated that the aforedescribed means and method for distinguishing between the code types is based on the recognition that cycle repetition for pulse-type codes is never quicker than fifty microseconds. Thus, the pulse-type transmitters of the art will never accomplish seven complete cycles within the allotted three hundred and fifty microseconds. On the other hand, in carrier-type IR transmitters, bursts of pulses of a carrier frequency are transmitted. Since a pulse burst will always include at least seven full cycles, and the cycle time is never as much as fifty microseconds, seven complete cycles will be completed within the three hundred and fifty microseconds. Those skilled in the art will appreciate however, that other lengths of time and cycle number thresholds could be utilized provided the carrier-type and pulse-type transmitters will be distinguished thereby.

Once a determination is made as to the type of transmitter that is to be emulated, the capture of the code for each of the transmitter keys may proceed. According to the preferred embodiment of the invention, and as will be described in greater detail hereinafter, the prompting means of the apparatus 10 (e.g. the ROM 140 and microprocessor 70) is arranged to cause the LCD display 70 to instruct the user to press the keys of the remote control to be emulated in a certain order. As before, the IR waves are received by light-actuated diode 112, and a digital signal representing the waves is seen at the output of the receiver 110. Regardless of whether the received code is of the pulse-type or carrier type, the internal software counter of microprocessor 200 is cleared and a timer count table is initialized. Likewise, the four bit counter 122 is cleared and held clear so that its output at IQ3 is low. With a low IQ3 output, the inverter 127 provides a high signal to AND gate 128. Thus, the timer of microprocessor 200 will see the binary equivalent of the signal being received by receiver 110. If the received code was determined to have been of the pulse-type, the software counter is incremented upon receipt of a high signal from the receiver means 100 (i.e. the receiver has received a pulse). The software counter then continues to increment even when the signal to the timer goes low until the occurrence of the next high signal (pulse) at the timer of the microprocessor. When this second pulse is detected the software counter value is stored into the timer count table. If the table is exhausted, the sampling is terminated. If the table is not exhausted, the sampling continues.

With a determination of the time between pulses, the waveform for the particular key of the pulse-type transmitter may be emulated. This is so due to the fact that pulse-type waveforms have a relatively consistent pulse width of from ten to twenty microseconds. Thus, by determining the total time between the start of two pulses, the pause time between pulses can be determined by subtracting ten (or up to twenty) microseconds from the total time. The pulse may then be reconstructed by emitting a pulse of ten (or up to twenty) microseconds followed by the determined pause.

The code for a key of the carrier type transmitter may be captured in a similar manner to that of the pulse-type. With four bit counter 122 and the internal software counter cleared and a timer count table initialized, the software counter is incremented upon receipt by the timer of the microprocessor 200 of a high signal. The software counter is continually incremented as long as the carrier is present. The presence of the carrier is determined by monitoring the signal at the timer input. If the signal at the timer changes over a short period of time (e.g. less than fifty microseconds), then the carrier is considered to be present. Once the timer signal is static, then the carrier is no longer present and the value of the software counter is stored into the timer count table. The software counter is then zeroed and incremented continually again until a carrier is again detected at the timer. If the software counter reaches its maximum value, it is assumed that no IR waveform is present and the sampling is terminated. If a carrier is detected before the software counter reaches its maximum, the "carrier pause" count is stored into the timer table. Sampling then continues as described until the table is exhausted.

It will be appreciated that by timing the length of the carrier signal (burst length) as well as the pause time between signal bursts, all modes of carrier-type code may be reconstructed. This is so because the frequency is already known due to a determination made when the signal type was determined.

Turning to FIG. 2b, other aspects of the invention may be understood with reference to the hardware. As previously indicated, the apparatus of the invention has two major modes: a capture mode where the apparatus 10 is capturing the code of other remote control systems, and an operate mode where the apparatus 10 is being used to operate and control consumer products. (It should be noted that within the operate mode there is an active mode where user control is being exercised, and a sleep mode which conserves energy when no instruction has been received for a predetermined length of time.) Thus, a switch 162 which is manually controllable is provided as part of the capture/operate selection logic 160 to inform the microprocessor 200 as to which mode is desired. The mode is determined by reading the input INT2 into the microprocessor 200. During the reading of INT2, pin 10 (port B7) of the microprocessor is driven high. As a result, pin 13 of NAND gate 163 goes high, thereby permitting the position of switch 162 to dictate the state of the output of NAND gate 163. Thus, when switch 162 is in the capture position, the output of NAND gate 163 goes low, and inverter 164 supplies a high input into port INT2. When switch 162 is in the operate position, NAND gate 163 supplies a high signal to inverter 164, which in turn supplies a low signal to the INT2 input of microprocessor 200.

The capture/operate logic 160 also provides an external timeout function. If the switch 162 is switched from operate mode to the capture mode, the RC circuit comprised of resistor 165 and capacitor 166 is arranged to provide a time-out of approximately twenty-two seconds. If no signal is received by receiver means 110 during that time, NAND gates 163 and 164 are arranged such that an interrupt signal will appear (at INT2) at the microprocessor 200.

Power-up reset circuit 170 ensures that the microprocessor 200 will properly reset when a new battery of power and timer section 210 (see FIG. 2c) is inserted. As long as a battery is in place, transistor 172 is off and the NOT reset input into microprocessor is high due to an internal pull-up resistor. When the battery is removed, transistor 172 turns on due to resistor 176 driving the base low, and the capacitor 174 instantaneously discharges. This assures that if will occur each time contact is broken. Upon final insertion of the battery, transistor 172 turns off allowing capacitor 174 to charge via the internal resistor of the NOT RES input. This RC combination provides the proper rise time to reset the microprocessor.

Keyboard interrupt logic 180 provides another function for the apparatus 10. Thus, if the microprocessor is in the operate/sleep mode, or if the microprocessor is conducting certain portions of the capture process as will be discussed hereinafter, the pressing of a key of keyboard 15 will cause an interrupt to occur. The interrupt occurs as a result of a positive signal into OR gate 182, which responds with a high output. Inverter 184 in turn inverts the high OR gate output to provide a low signal to a NOT INTERRUPT input of microprocessor 200. It will be appreciated that the positive signal into OR gate 182 is produced by the voltage dividers consisting of R4–R10 and R11–R18 (of FIG. 2a) which act as a scanner of keyboard 15. With one input (pin 12) of NAND gate 185 in a low state, the output of NAND gate 185 will be high. With the other input (port A0 of the microprocessor) into NAND gate 186 being set high, the output of NAND gate 186 will be low. Thus, a key closure will pulse OR gate 182 with a voltage of approximately 0.8×VCC.

An additional function of operate wake-up logic 190 comprised of NAND gates 185, 186 and associated circuitry, is to produce an interrupt via the NOT INT port of microprocessor 200 when switch 162 is moved from the operate to the capture position during the sleep mode. With switch 162 in the operate position, the pin 12 input into NAND gate 185 is low thereby forcing the output of NAND gate 185 high. With port A0 in the high state, and the output of NAND gate 185 also high, the output of NAND gate 186 will go low, thereby producing a low on all the inputs of OR-gate 182. The resulting low signal on the output of OR gate 182 is inverted by inverter 184 which holds the NOT INT port high. Thus, the microprocessor 200 will not be interrupted. However, when switch 162 is placed in the capture position, a high signal is placed on capacitor 187. This high signal is propagated to the pin 12 input of NAND gate 185. Because the pin 13 input into NAND gate 185 is already high, the high pulse on pin 12 produces a low pulse on the output of NAND gate 185 which is inverted by NAND gate 186. As a result, the inputs into OR gate 182 are high. With a high output of OR gate 182 being inverted by inverter 184, a low signal is generated at the NOT INT port of microprocessor 200 with a resulting interruption.

Figure 2C:
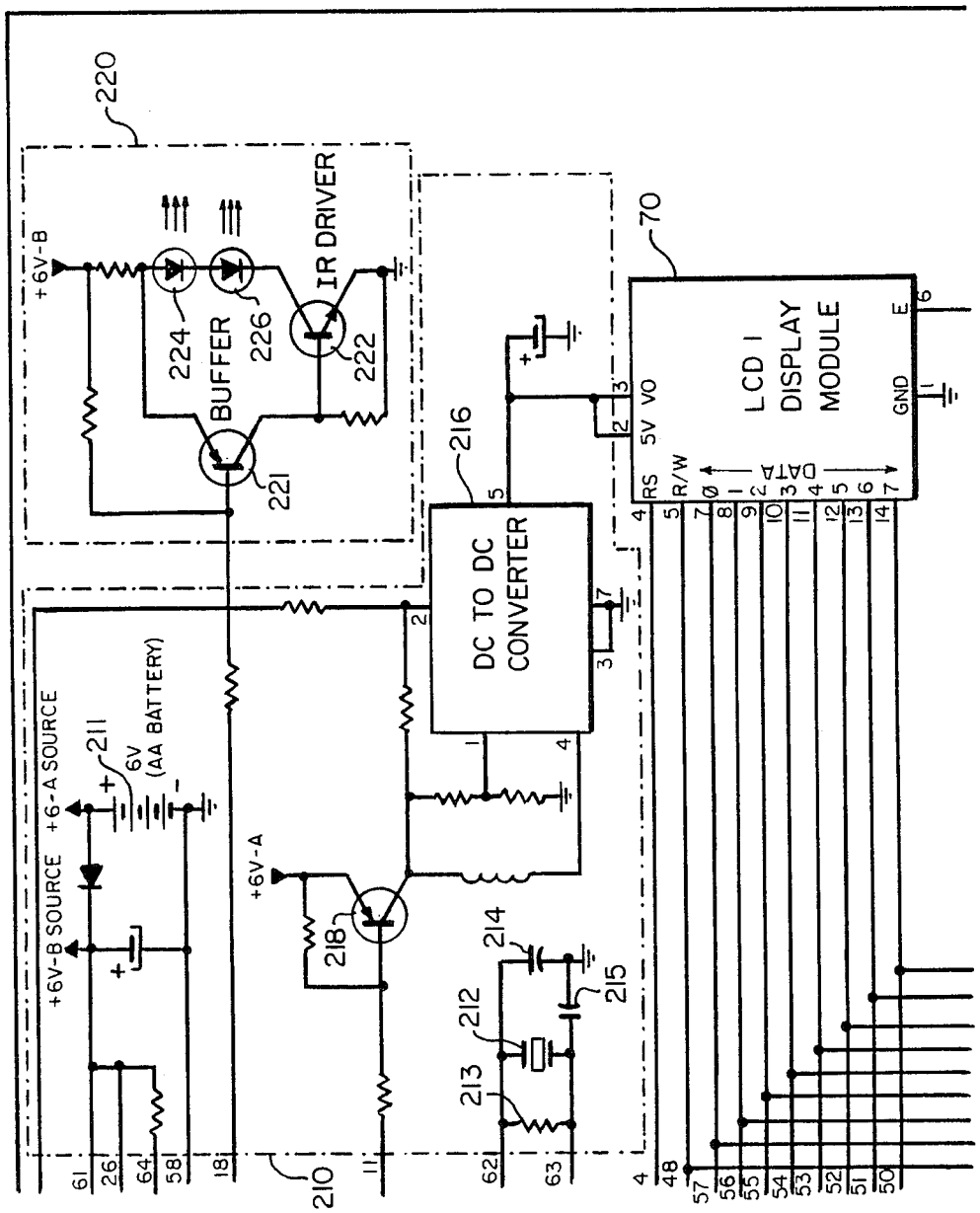

Turning to FIG. 2c, the power and timing means 210 of apparatus 10 is seen and includes a battery source 211 and associated circuitry which provides a voltage which powers both the microprocessor 200 and the other circuitry. Power and timing means 210 also includes a crystal 212 in parallel with a resistor 213 and capacitors 214 and 215 for providing the desired internal clock for the microprocessor 200. Power and timing means further includes a conventional DC to DC converter 216 and associated circuitry which is used to maintain a constant voltage (approximately 0.5 V) which is necessary for maintaining a consistent contrast ratio on the LCD display 70.

Also seen in FIG. 2c is the infrared emitter means 220. Upon an appropriate signal from the microprocessor 200, transistor 221 is powered, thereby causing it and transistor 222 to turn on. With transistor 222 being on, current will flow through light emitting diodes 224 and 226, and infrared rays of the proper frequency with proper burst length separated by desired pause times will be emitted if a carrier-type wave is being emulated. Otherwise, infrared rays of a pulse length of ten to twenty microseconds spaced by pauses of determined lengths will be emitted for the pulse-type wave to be emulated.

In FIG. 2d, the RAM 130 and ROM 140, and the bank select and decode circuitry 150 for addressing the same is shown. The RAM 130 is preferably an 8K by 8 RAM used mainly for storage of captured code information. Battery backup is provided via a three volt lithium battery 131 with diode isolation via diode 132. The RAM is memory mapped and is part of the bank select scheme. The ROM 140 is preferably a 16K by 8 ROM containing all control software for the microcontroller, and the text for controlling the LCD 70. Because the microprocessor 200 has no on-board ROM, the lower 8K of ROM is mapped in such a way that if an address in the range 0000H to 1FFFH is accessed, the ROM will be selected. The upper 8K of the ROM memory is part of the bank select scheme.

It will be appreciated that the RAM 130, the ROM 140, and the LCD 70 all share a common data bus 145. Thus, the bank select and address decode logic 150 provides for the proper selection of the desired component in the system. The RAM and while the ROM covers the full addressing range of 0000H to 3FFFH. However, using three control signals from the microprocessor 200, and inverters 151, and 152, AND gates 153, 154, and 155, and NAND gates 156, 157, 158, and 159, the proper component is selected as will be appreciated by those skilled in the art.

Figure 3:
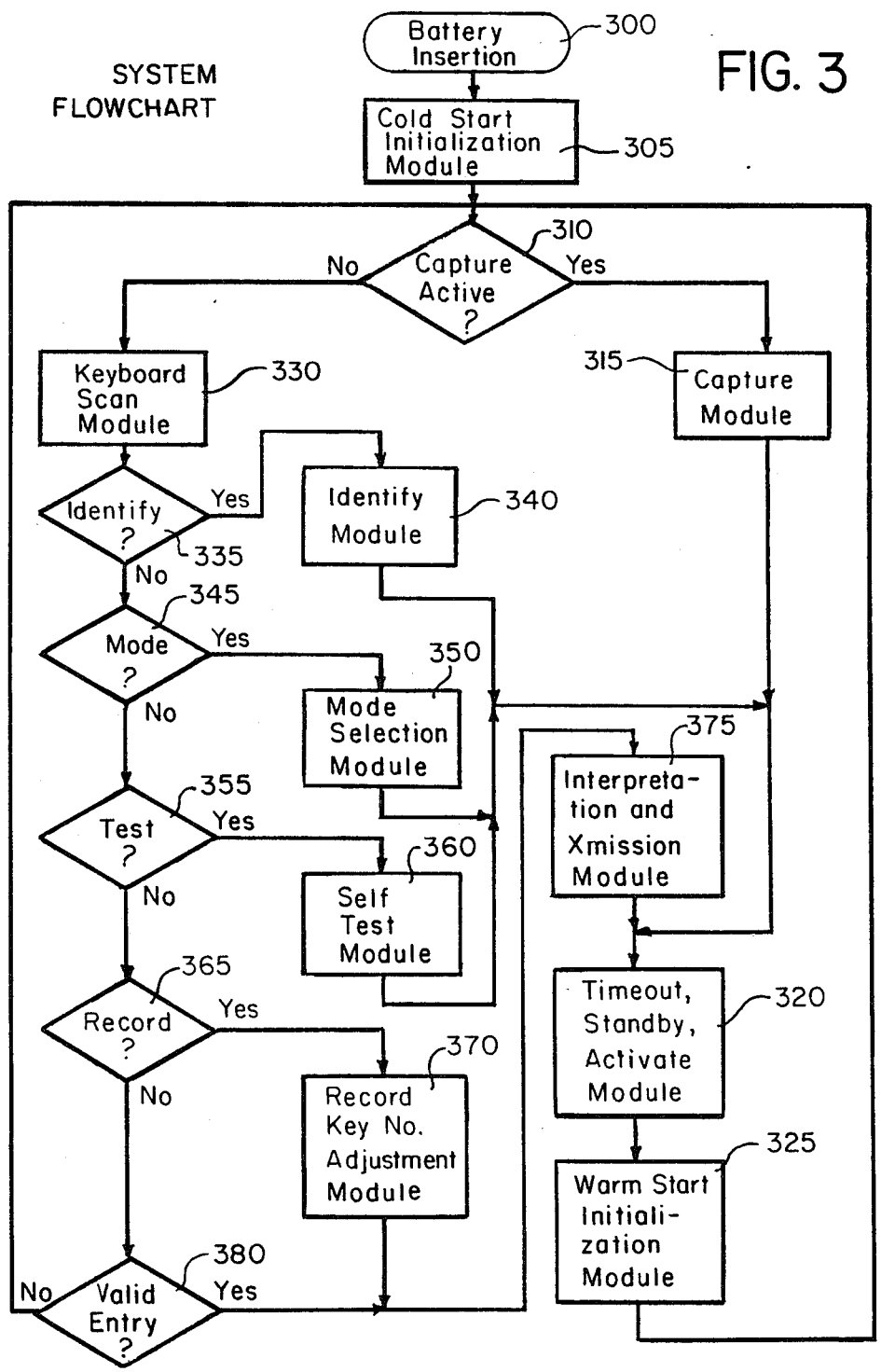
FIG. 3 is a flow diagram for the microprocessor of the reconfigurable remote control apparatus.

Turning to FIG. 3, a top level flow diagram for the microprocessor 200 of the reconfigurable remote control apparatus 10 is seen. Upon insertion of a battery at 300, the microprocessor 200 is reset (cold start) at 305 as its reset input is toggled by the aforedescribed reset circuitry 170. Because the reset routines are not critical for an understanding of the invention, they will not be discussed in detail herein. Those skilled in the art will understand, however that during a cold start reset the microprocessor 200 as well as its associated circuitry (with the exception of ROM 140) are initialized to their proper starting values. After initialization, the microprocessor determines at 310 whether the capture/operate switch 162 is switched into the capture position. If the user has placed the switch in the capture position, the microprocessor 200 enters at 315 its capture mode which is described in detail with reference to FIG. 4. As will be indicated hereafter, completion of the capture mode is had due to a timeout measured by timeout circuitry 165 and 166, due to completion of the capture sequence, or due to movement of switch 162 into the operate mode. Upon completion of the capture mode, the microprocessor 200 enters at 320 a timeout, standby and activate module. Thus, at 320 a determination is made whether no key closures have occurred within another predetermined amount of time. If no key closures occur, the microprocessor 200 will place the apparatus 10 into a "sleep" or "standby" mode where battery power is conserved. Once in sleep mode, a key closure will cause keyboard interrupt logic 180 to interrupt the microprocessor sleep routine and activate the microprocessor. Or, if the switch 162 is moved into the operate position, operate wakeup logic 190 will likewise cause the sleep routine of microprocessor 200 to be interrupted. Regardless, upon activation, the microprocessor exercises at 325 its warm start initialization module which resets variables, ports, and RAM location values.

Returning to step 310, if the switch 162 is in the operate position, the output of the user keyboard is scanned at 330. First a determination is made at 335 as to whether the VCR Record key of keys 30 has been pressed simultaneously with the VCR or CBL power key of keys 60. If so, at 340 the VCR and cable converter identification module is entered. The purpose of the module is to permit the apparatus 10 to control a VCR or cable system, and towards that end the infrared codes of various VCR and cable systems are stored in ROM 140. Thus, at 340, the microprocessor 200 causes the LCD 70 to display the following:
Random
Search with the top left button of the eight soft buttons
  20 being used for Random, and the bottom left button being used for Search. If the top left button is pressed, the LCD will prompt the following:
  Enter two digits from lookup table. The user will then have five minutes to enter the first digit and two more minutes to enter the next digit corresponding to a two digit code for the brand names of various VCR's or cable. If an incorrect key is pressed, an error message will appear on the LCD and the user will be given an opportunity to try again. If no digit is entered, the microprocessor will exit the identify module 340 and go to timeout, standby, and activate module 320.

If instead of the top left "Random" button being selected, the user selects the bottom left button and holds the button, the microprocessor will initiate a search mode. The microprocessor 200 will cause the transmitter section 220 to send five channel up commands for each type of VCR or cable system whose code is stored in ROM 140. The user can then release the "Search" key when the VCR or cable system starts responding to the transmitted commands.

If the VCR Record and VCR or CBL power keys have not been pressed simultaneously, the microprocessor 200 determines at 345 whether any of the system keys 60 have been pressed. If so, the microprocessor 200 enters the system selection module at 350. Thus, if a system key 60 has been pressed, the last used LCD soft key menu for that system will appear on LCD 70. At this time the eight soft keys 20, the two power keys 68 and 69 and the seventeen volume and channel control keys 40 will issue commands for the selected system. The same system key menus for that system, or, if desired, another system key may be pressed to select another system. If another system key is pressed, the last used LCD soft key menu for the new system will appear and control will resume as aforedescribed. After the microprocessor has stepped through the system selection module, the microprocessor returns to timeout, standby activate module at 320.

If a system key had not been pressed at 345, the microprocessor determines at 355 whether two predetermined keys are simultaneously closed to place the microprocessor into a self-test module at 360. Again, because the details of the self-test module are not particularly important for purposes of the instant invention, they are not discussed in detail. As with the identify module 340, and the system selection module 350, upon completion of the self-test module 360, the microprocessor returns to block 320.

If the two predetermined keys representing the self-test sequence were not pressed at 355, the microprocessor determines at 365 whether the Record and Play keys of the VCR have been pressed simultaneously. If so, the microprocessor enters the record key number adjustment module at 370. In the record key number adjustment module when a key is pressed and the keyboard read, an associated key or index number is generated. This index number is then used to determine which function is to be transmitted. Since a double key closure produces two numbers, a predetermined index number for RECORD must be substituted into the variable designated as the final index to be used for function retrieval. Upon exiting the record module, the provided information is sent at 375 to an interpretation and transmission module were the microprocessor determines what infrared code must be sent to the remote VCR infrared code can be generated by the light-emitting diodes 224 and 226. After the transmission of the code, the microprocessor returns to the timeout, standby, activate module 320.

If the Record and play keys of the VCR keys 30 have not been pressed, the microprocessor determines at 380 whether the pressed keys are valid entries. If the first key pressed was an LCD soft key 20, the TV menu will appear on the LCD and the TV command selected will be sent at step 375. Or, if the first key pressed is one of the group 40, the LCD will remain off and the commands will be sent at step 375 to the main TV. Further, if the first key pressed is one of the VCR dedicated group of keys 30, the command will be sent at step 375 to the last selected VCR. If no VCR has been identified at step 340, nor captured in the capture module, the default system code will be sent.

Figure 4:
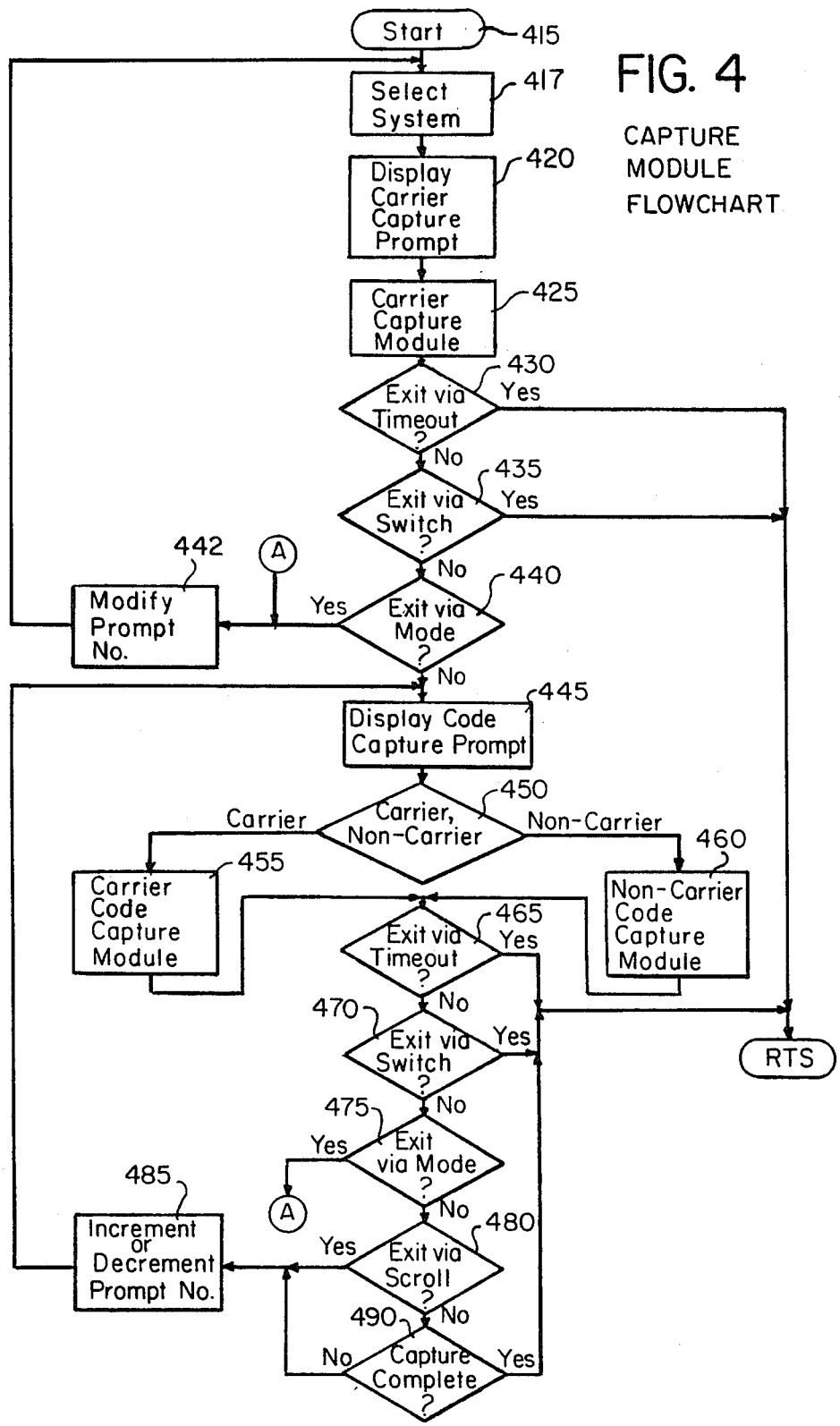
FIG. 4 is a flow diagram of the capture module of FIG. 3.

The broad flow of the capture module of step 315 is seen in FIG. 4. Thus, after entering the capture module at 415, the user is prompted by the LCD 70 at 417 to select a system by pressing one of the six system keys of keys 60. The selected system is then shown with a two letter code at the very edge of the LCD 70. Upon selecting a system, the remote control transmitter of the system to be captured must be placed head to head with the transmitter 220 of apparatus 10 to permit capture. Thereafter, all information sent to LCD 70 is displayed as a prompt as indicated at 420, and is arranged upside down on LCD 70 such that the user will be easily able to read the messages while operating the keys of the remote control system to be captured. The changing of the LCD display may be effected by either causing the information to be sent in a different manner from microprocessor 200, or, if LCD 70 has signal to the LCD and having it internally rearrange the received information. Regardless, at 425 the microprocessor enters the carrier capture module where a determination is made as to whether the remote control code to be captured is of the pulse-type protocol or of the carrier-type protocol. Also, in the carrier capture module, if the code to be captured is of the carrier-type protocol, the frequency of the carrier is determined.

Figure 5A:
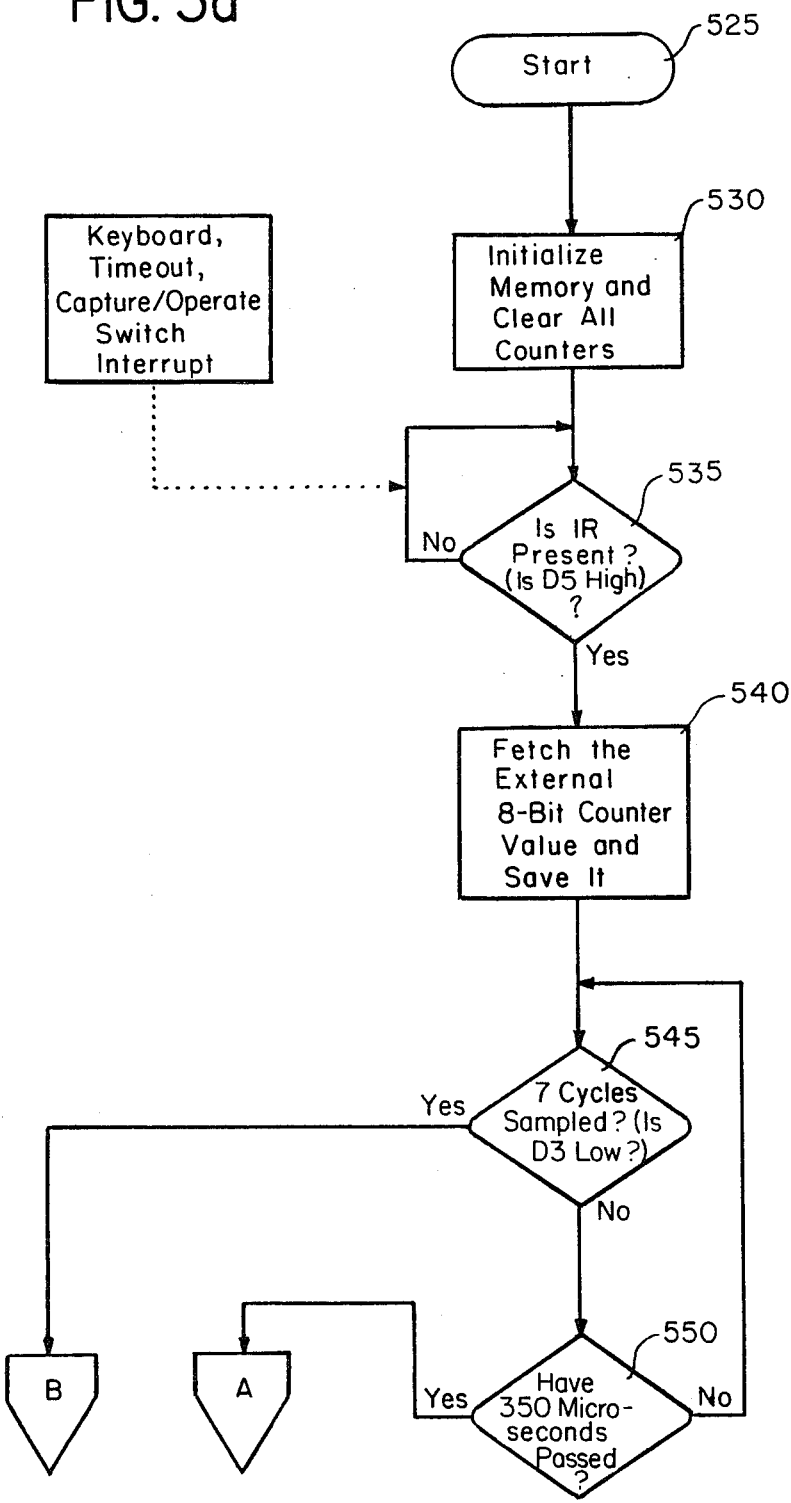
FIGS. 5a and 5b are flow diagrams representing the carrier capture module of FIG. 4.
Figure 5B:
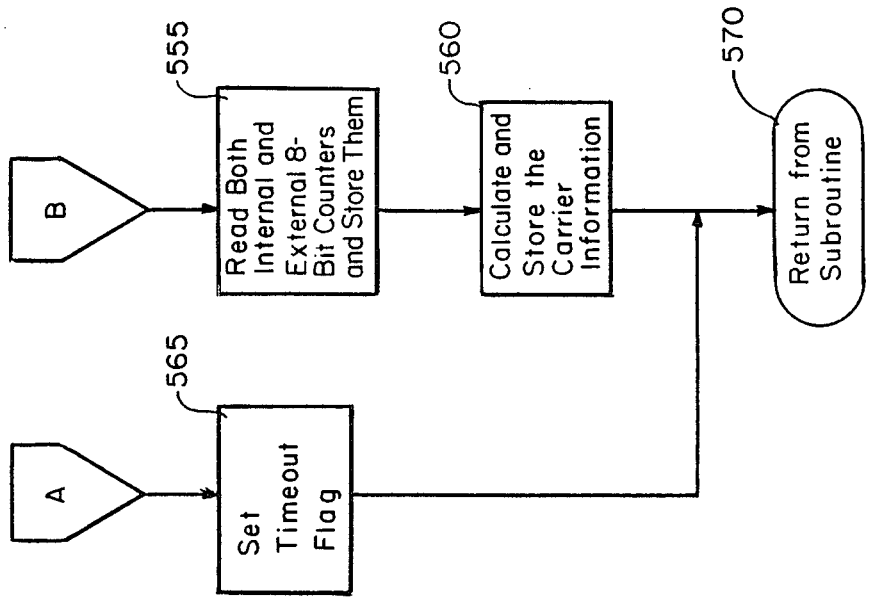

Turning to FIGS. 5a and 5b, the details of the flow of carrier capture module of step 425 is seen. Thus, upon entering the module at 525, the RAM 130 is initialized and the counters described with reference to FIG. 2 are cleared at 530. At 535, a determination is made as to whether infrared rays are being received by receiver 110. If not, the system waits until the rays are received or until an interrupt occurs as at 537 due to a timeout, the pressing of a keyboard key, or the switching of capture/operate mode switch. If an interrupt occurs, the carrier capture module is exited as will be described hereinafter. If no interrupt occurs, when the IR rays are detected, the count of eight bit counter 124 is fetched and saved at 540. The microprocessor then determines at 545 whether seven cycles have been sampled. If seven cycles have not been sampled, a determination is made at 550 as to whether three hundred and fifty microseconds have elapsed. If not, the program return to step 545 and back to step 550 until either seven cycles have been sampled or the three hundred and fifty microseconds have elapsed. If seven cycles are sampled before the time elapses, the counts of the internal counter of microprocessor 200 and the count of the eight bit counter 124 are read and stored at 555. Then, in accord with above description, the carrier frequency is calculated at 560 and the elapses before seven cycles are sampled, the sampled code is of the pulse type, and a timeout flag is set at 565 to stop the sampling and to note the indication of a pulse-type code. Again, the subroutine is exited at 570.

Returning to FIG. 4, and as indicated above, during and after the carrier capture module 425, the entire capture module of step 315 may be exited in any of three ways: via a timeout as indicated at 430; via a key closure or by switching switch 160 into the operate position as indicated at 435; or if neither a timeout nor a switch change occurs, by a microprocessor determination at 440 whether another system key 60 has been pressed. If another system key is pressed, a new two letter code is generated at 442 and shown on the LCD 70 for the new system being captured. Then steps 420, 425, 430, and 435 are repeated. If no system key is pressed at 440, the microprocessor then instructs the LCD 70 at 445 to indicate which key is to be pressed on the other system so that its code can been captured. Of course, depending on the code type (pulse or carrier), a different algorithm is utilized to capture the code. Thus, at 450 a decision is made by the microprocessor based on the code type captured. If the code type is a carrier-type code, the carrier code capture module (described in detail with reference to FIGS. 6a–6c) is entered at 455. On the other hand, if the code is a pulse-type code, the pulse code capture module (described with reference to FIGS. 7a and 7b) is entered at 460.

The modules 455 and 460 may be exited in any of several manners. If no instructions are received by the microprocessor from the user, the modules are exited at 465 via timeout. Or, if switch 162 is moved into the operate position, the modules are exited at 470. At 475, the modules may be key is pressed, the microprocessor program returns to step 442 where the LCD display is modified.

If modules 455 and 460 are not exited at 465, 470, or 475, the completion of code capture may be expedited as indicated at 480 by scrolling through the prompts of the modules. As will be indicated hereinafter, because the apparatus 10 steps the user through the keys to be pressed on the remote to be captured in a predetermined sequence, it is desirable to permit the user to scroll forward or backward through the sequence to avoid repetition if some code has already been captured. Scrolling is provided by using soft keys 20 which are labelled by the LCD for that purpose while in the code capture modules. Thus, if the user scrolls through the prompts to a desired prompt, at 485 the LCD is directed to display the key to be captured. Then the program returns to step 445 where the capture process continues. If the user scrolls through to the end of the prompt messages for a device to be captured, a wrap-around causes the first prompt message to reappear.

If the modules of steps 455 or 460 are not exited at 465, 470, 475 or 480, a determination is made at 490 as to whether the capture of the remote code is complete. If the capture is complete (i.e. the last prompt of the prompt sequence has been completed and the last function has been captured), the microprocessor returns to step 320 of FIG. 3. Otherwise, the LCD is directed at step 485 to change the prompt number, and the program returns to step 445 where the new key to be captured is displayed on LCD 70.

Figure 6C:
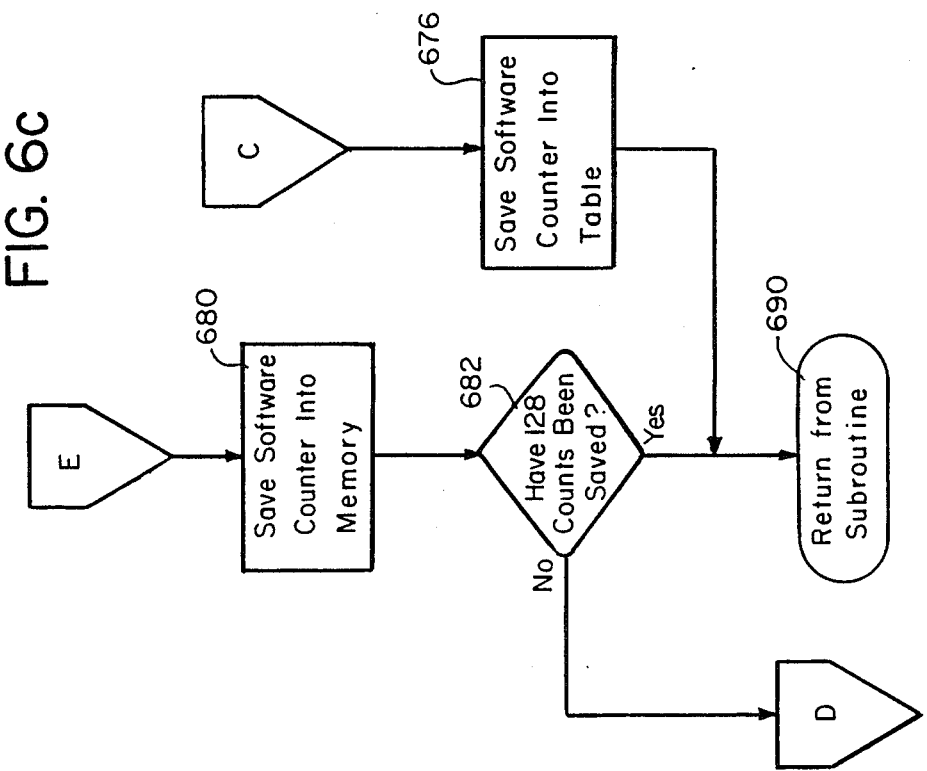
Figure 6B:
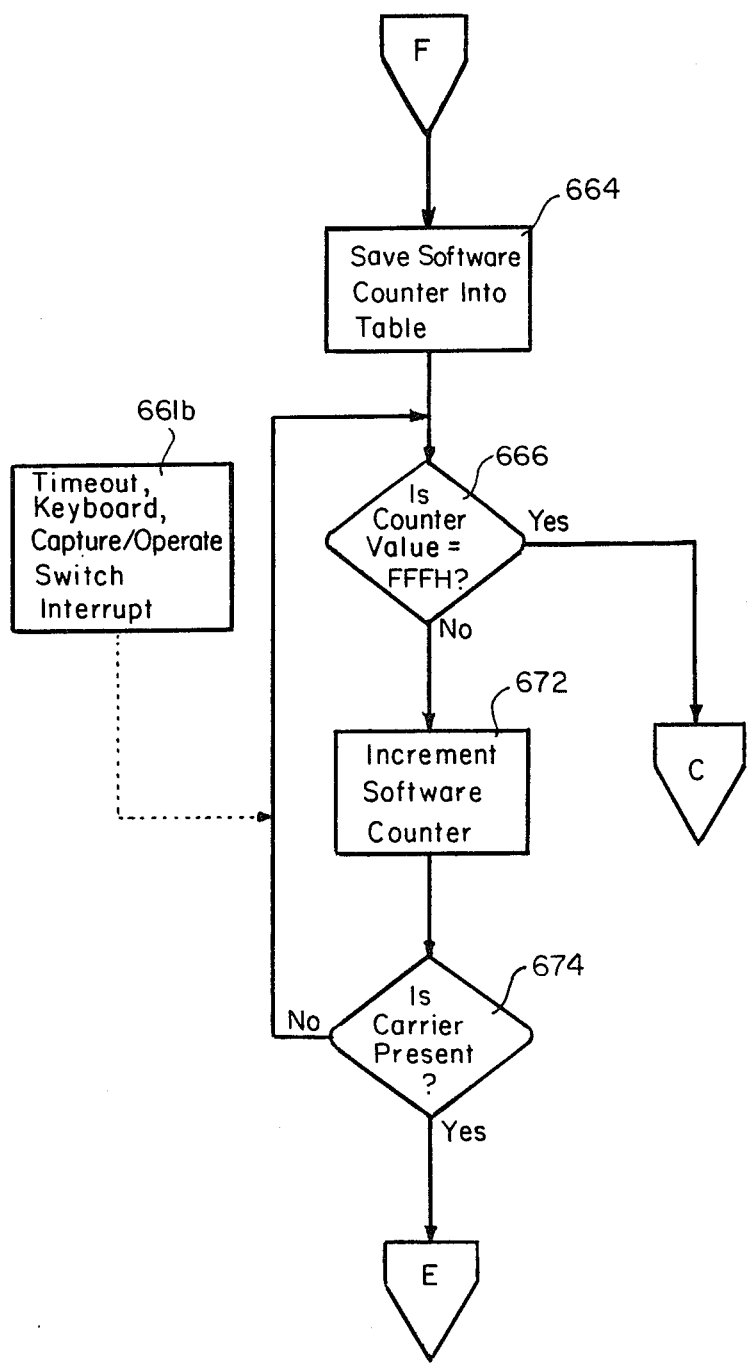

Turning to FIG. 6a–6c, a flow-chart of the code capturing algorithm for carrier-type codes is seen. The algorithm starts at 655 when it is determined that code for a carrier-type system is to be captured. At 656, the RAM 130 is initialized and the counters described with reference to FIG. 2 are cleared. At 658 a determination is made as to whether infrared rays are being received by receiver 110. If not, the system waits until the rays are received or until an interrupt occurs as at 661a due to a timeout, the pressing of a keyboard key, or the switching of capture/operate mode switch. If an interrupt occurs, the carrier capture module is exited as was previously described with reference to FIG. 5.

Upon detected by receiving means 110 of a carrier, the software counter of microprocessor 200 is incremented at 660 and as indicated at 662 continues to be incremented as long as the carrier is active regardless of whether the signal is high or low at a particular time. In other words, the software counter is measuring the length of a burst which is comprised of many cycles. When the burst is finished, the count of the software counter is saved into RAM at 664 and the counter is reset. Then, at 666, a determination is made as to whether the counter value is at its maximum. If the counter value is not at its maximum, the software counter increments at 672 and a determination is made at 674 as to whether the carrier has started again. If the carrier has not started again, and the counter value does not reach its maximum, the software counter continues to increment. Upon reaching a maximum at 666, the count is saved into RAM at 676 and the subroutine is exited at 690. However, if the counter value does not reach its maximum before a carrier is detected (i.e. a new burst), or before an interrupt occurs at 661b due to reasons previously discussed with reference to step 661a, the count reached when the carrier is detected at 674 is saved at 680 and stored in RAM. This count will be recognized as providing the pause length in between bursts. Then, at 682 a determination is made as to the number of counts that have been saved into RAM. If a suitable number of counts (e.g. one hundred and twenty-eight; sixty-four burst length and pause length samples) have been saved, the microprocessor exits the subroutine at 690. Otherwise, the microprocessor returns to step 658 and awaits a carrier to be present so that the subroutine may be repeated for more burst length an pause length samples. Thus, upon reaching either a time limitation (i.e. the counter value reaches its maximum at step 666), or upon obtaining the desired number of samples at step 682, the subroutine terminates at 690.

Figure 7A:
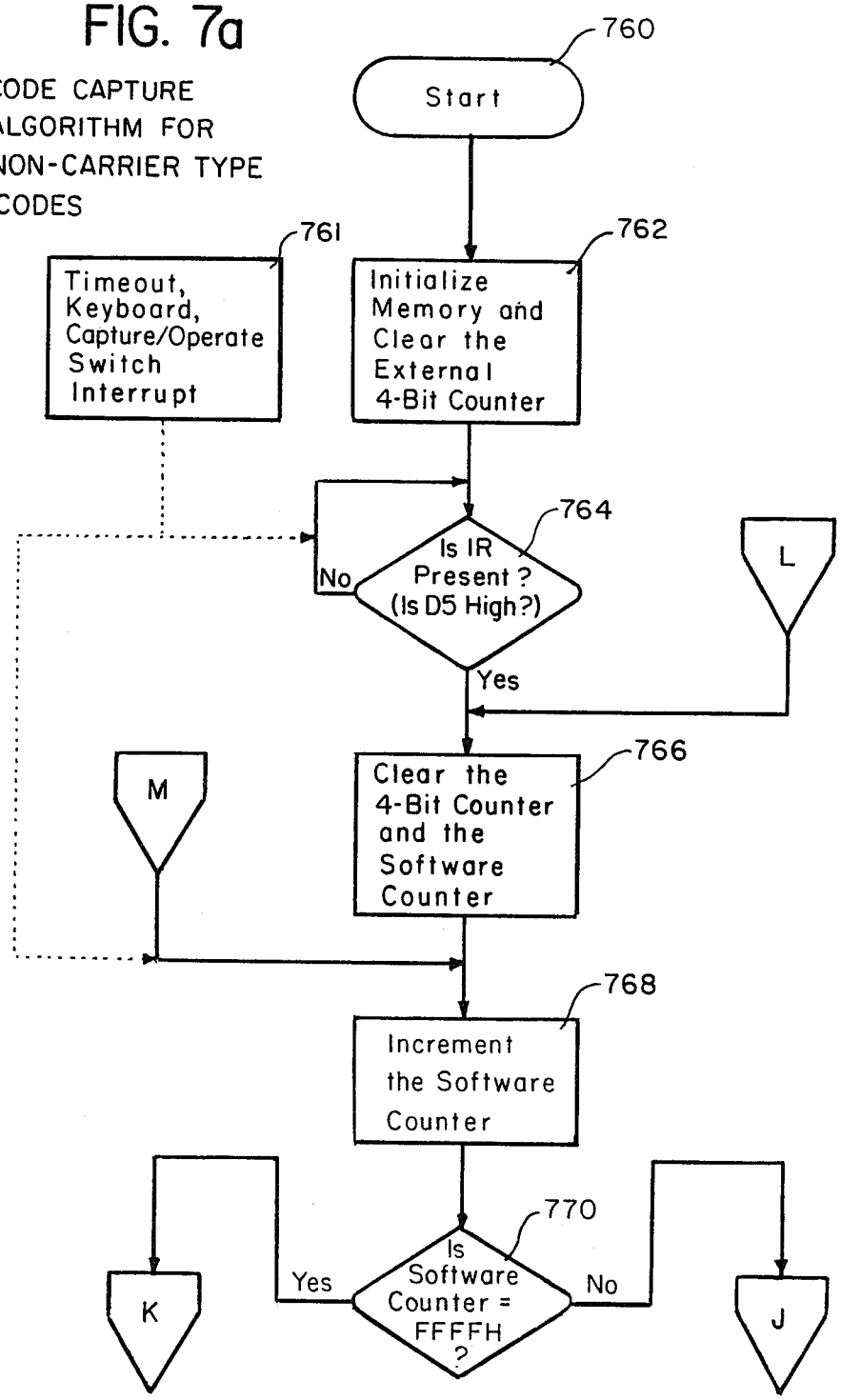
FIGS. 7a and 7b are flow diagrams representing non-carrier code capture module of FIG. 4.
Figure 7B:
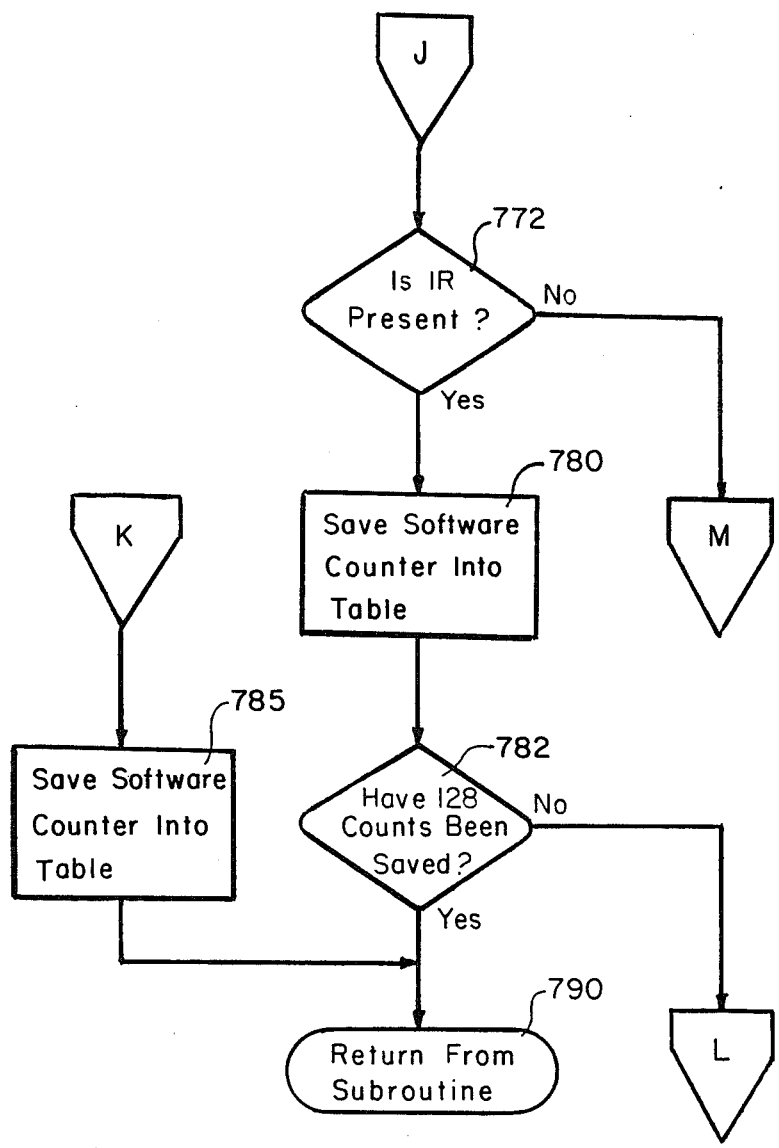

Turning to FIGS. 7a and 7b, a flow-chart of the code capturing algorithm for pulse-type codes is seen. The algorithm starts at 760 when it is determined that code for a carrier-type system is to be captured. At 762, the RAM 130 is initialized and the four bit counter 122 described with reference to FIG. 2 is cleared. At 764 a determination is made as to whether infrared rays are being received by receiver 110. If not, the system waits until the rays are received or until an interrupt occurs as at 761 due to a timeout, the pressing of a keyboard key, or the switching of capture/operate mode switch. If an interrupt occurs, the carrier capture module is exited as was previously described with reference to FIG. 5.

If an infrared signal is received at receiver 110, the four bit counter 122 and the software counter of microprocessor 200 are cleared at 766 (during the length of the ten to twenty microsecond pulse) and the software counter is incremented at 768. The software counter continues to increment until either it reaches it maximum value at 770 at which time the software count is saved into RAM 130 at 785 and the subroutine is exited at 790, or until a determination is made at 772 that a new pulse has been received. If a new pulse is received, the count of the software counter is stored into RAM at 780. In this manner the pause time of the pulse-type code may be determined by subtracting ten microseconds from the total cycle time. Once the count is saved into RAM at 780, a decision is made at 782 as to whether one hundred twenty-eight counts have been saved, representing the length of one hundred twenty-eight complete cycles. If a suitable number of counts (e.g. one hundred and twenty-eight) have been saved, the microprocessor exits the subroutine at 790. Otherwise, the microprocessor returns to step 766, clears the software counter and four bit counter, and starts incrementing the software counter at 768. Thus, upon either obtaining the desired number of samples at step 782, or due to a timeout when the remote system is no longer sending pulses, the subroutine terminates at 790.

While capturing all of the desired samples for a particular remote control system, it will be appreciated that the information is preferably compressed so that the code can be stored in ROM for future reference. Thus, in accord with the preferred embodiment of the invention, the various samples obtained for each captured code are averaged to provide a normalized or averaged timing sequence for bursts and pauses for the carrier-type codes, and for pauses in the pause-type codes. The normalized information is then subjected to a preferred compression technique hereinafter described. If the received code for each key of the transmitter to be emulated is lengthy, a repeating type waveform is indicated. However, if the microprocessor is incapable of finding a repeat upon processing, the user is prompted to repeat the pressing of the key. If after receipt of additional samples, the microprocessor is still incapable of finding the repeat, the user will be asked whether a new remote transmitter was introduced during the capture process. If a new remote was introduced, the user will be asked to press any key, and the type of code will be determined. The capture sequence will then continue as aforedescribed. However, if a new remote was not introduced, and the user was properly attempting to capture a carrier-type code, the user will be informed that the particular remote cannot be captured and/or referred to an owner's manual.

Upon the recognition of patterns and repeats, the captured code is preferably compressed according to the below-described compression technique. Then, during operation of the apparatus 10, when it is desired to emulate one of the transmitter codes which has been captured and compressed, the code may be expanded.

Turning to FIG. 8, an array (ARRAY A) 810 is seen which represents data obtained from a captured key of a remote device. Likewise, a plurality of smaller arrays (ARRAY B, C, and D) 820, 830, and 840 are seen which encode in a compressed format the particular captured array. In particular, Array A is the normalized data array for a carrier type infrared transmitter code that has been captured. The code of Array A is for one key function of the captured transmitter, with a first alternating sixteen-bit count value (as indicated by two groups of two hexadecimal symbols) representing a carrier burst duration time, and a second alternating sixteen-bit count value representing a delay duration (pause) time between bursts. In the provided example, the duration times are found by multiplying the count value by forty-five microseconds. Thus, the sixteen bit count value (00C8) located at locations 2000 and 2001 represents a burst duration time of nine milliseconds as 00C8 is the hexadecimal representation of two hundred, and two hundred times forty-five microseconds equals nine milliseconds. Likewise, the next sixteen bit count value (locations 2002 and 2003 would represent a delay duration of approximately four and a half milliseconds as 0065 is the hexadecimal representation of one hundred and one, and one hundred and one times forty-five microseconds is approximately four and a half milliseconds. It will be recognized that with the "map" of Array A 810, and a knowledge of the carrier frequency (which is stored in another array or memory location not shown), the captured infrared signal may be accurately generated.

A careful review of Array A 810 reveals that the burst and pause durations are repeated throughout the captured signal. Thus, according to the preferred embodiment, all durations for a particular transmitter or transmitter category are stored in a separate array such as Array D 840. As shown in FIG. 8, Array D 840 only stores seven unique sixteen bit durations as that is all that is found in Array A 810. However, as additional keys from the remote which is being captured are pressed, additional unique durations are inserted into Array D 840 such that Array D will include all possible durations for all available keys of a particular remote. It will also be appreciated, that a plurality of plurality of transmitters which are captured.

The seven durations fond in Array D 840 are listed as elements zero through six of Array D. However, as found in Array A 810, only certain of the seven listed elements of Array D 840 ever follow certain of the other seven listed elements. For example, element "0" (00 C8) is followed only by element "1" (00 65) or by element "5" (00 31). Thus, a third array, Array C 830 may be constructed having elements which are comprised of two nibbles, with each nibble representing an element of Array D 840. In essence, then, Array C 830 is a pointer into Array D and includes as elements those duration combinations (sixteen bit burst length followed by a sixteen bit pause length) which appear in Array A 810. It will be appreciated that where a plurality of remotes are to be captured and stored, a plurality of arrays such as Array C 830 must be determined and provided as pointers to the plurality of arrays such as Array D.

Because the capture code data as shown in Array A 810 consists of a few unique durations as set forth in Array D 840, and because the durations as set forth in Array D 840 only appear in a certain number of combinations as referenced by Array C 830, it should be appreciated that the captured code of Array A 810 may be represented by an array (Array B 820) which contains pointers into Array C 830. Thus, Array B is constructed of bytes (eight bits) having two nibbles, with a first nibble referencing a first element of Array C 830, and the second nibble referencing a second element of Array C 830. A byte of Array B 820 therefore references two duration combinations of Array C 830 equivalent to four sixteen bit durations of Array D 840. In other words, an entire line (eight sixteen bit words) of Array A is compressed into two serving as expansion code. With each key of a remote device generating an array such as Array A, it will be appreciated that all that need be stored is an array similar to Array B for each key, plus Arrays C and D. Clearly, considerable compression of at least approximately eight to one is accomplished in this manner.

As indicated in FIG. 8 with reference to Array A 810, bytes 2000 through 208F is the minimum data required for code regeneration. This is true because the particular captured code uses a certain set of duration combinations to indicate a repeat (i.e. that the pressed key is still pressed and that the instruction is to be repeated). With regard to Array A 810, the repeat data is comprised of a four sixteen bit word code of "00C8 0031 000C 088B" which translates to a burst of nine milliseconds in duration followed by a pause of approximately two and one-quarter milliseconds followed by a burst of approximately 0.54 milliseconds followed by a pause of approximately ninety-eight and one half milliseconds. Upon receiving such a burst-pause sequence, the remote receiver would translate the information as a command to repeat the previously received key code. It will be appreciated that instead of continuing to store the repeat code into Array B 820, another array (Array G, not shown) may be kept which stores information as to which transmitter types or categories provides a repeat code. Thus, even further compression beyond the approximately eight to one ratio may be had. Of course, for another captured remote where a repeat code is not used but the entire key code is repeated, only the key code need be stored as a compressed array into Array B 820. An indication that the entire key sequence must be repeated is also then kept in an array such as Array G (not shown).

Where a captured transmitter transmits pulses and pauses rather than bursts at a carrier frequency followed by pauses, only the pause length need be stored as the pulse length is relatively standard as aforedescribed. In such a case, Array A 810 is preferably an array of pause lengths only while Arrays B 820, C 830 and D 840 provide the same function as before. Thus, Array D 840 includes all possible pause lengths for a particular remote, while Array C 830 acts as a pointer into Array D 840 and provides the possible pause couples (i.e. all different groups of two different pauses which are contiguous). Finally, Array B 820 used is the compressed version of Array A 810 and points to Array C 830.

With the details of the circuitry of apparatus 10, a flow chart description of the programming of the microprocessor 200, and the preferred data compression technique having been provided, the operation of apparatus 10 of the invention in the capture mode provides additional insight as to why the provided apparatus 10 is advantageous as compared to the reconfigurable remote control apparatus of the art. The user enters the capture mode by moving slide switch 162 into the capture position. Upon entering the capture mode, the microprocessor directs the LCD to prompt to place the apparatus 10 and the remote to be captured head to head so that the infrared transmitter or the remote to be captured and the receiving means 110 of apparatus 10 are facing each other. The user is then directed (in a display which is upside down relative to normal use, but now readable to the user) to "Select a system". The user selects a system to be captured by pressing one of the six system keys 60. If the user presses an improper key, the LCD will indicate "Invalid Entry, Select System Key". If no key is pressed within thirty seconds, the apparatus will go into the sleep state. If any key is pressed after the remote has entered the sleep state, the prompt "Capture Mode, Select System Key" will appear on the LCD. When the user selects a system key 60, if the TV is selected, the prompt "Codes known, do you want to change any?" will appear. One soft key will then be labelled "yes" and another "no". If "no" is pressed, the LCD will respond with "Select a system". If "yes" is pressed, the user will be advised to see the user's manual so that the pitfalls in programming main TV functions will be indicated. If the user still wishes to continue, the prompt "Press any key" will appear on the LCD so that the code type (carrier or pulse) of the remote to be captured may be determined. Then, the user will be prompted to "Press digit 0", "Press digit 1", "Press digit 2", . . . "Press digit 9", "Press channel up", "Press channel down", "Press alternate channel", "Press enter or 100", "Press volume up", "Press volume down", and "Press mute" in that order. These are all of the functions that are allowed to be replaced in the main TV system. Any of the functions may be bypassed using the "FWD" soft key. Once the capturing is complete for a particular system, the user is notified of the same by the LCD display for approximately three seconds. Control then reverts to the "Select a system" prompt previously described.

If instead of the TV key, the VCR key 64 is pressed as the system to be captured, the program continues with a "Press any key" prompt. Then, the following prompts are made: "press digit 0", "Press digit 1", "Press digit 2", . . . "Press digit 9", "Press channel up", "Press channel down", "Press alternate channel", "Press enter or 100", "Press volume up", "Press volume down", "Press mute", "Press play", "Press stop", "Press record", "Press pause", "Press rewind", "Press fast forward", "Press search >>", "Press search <<", "Press power", "Press slow", "Press TV/VCR", "Press X2", "Press frame advance", "Press reverse play", "Press one touch record", "Press standby", "Press timer", "Press normal", "Press OSD", "Press help", "Press program", "Press select", "Press up", and "Press down". It will be appreciated that because the last fifteen instructions are not available as keys on the provided keyboard 15, when using the apparatus 10 to instruct a remote VCR with these instructions, the appropriate soft keys must be pressed. Because fifteen additional instructions are provided, two menus of eight and seven instructions are provided to accommodate the same.

If the cable system key 65 is pressed as the system to be captured, the program continues with a "Press any key" prompt. Then, after the code is identified, the following prompts are made: "Press digit 0", "Press digit 1", "Press digit 2" . . . "Press digit 9", "Press channel up", "Press channel down", "Press alternate channel", "Press enter or 100", "Press volume up", "Press volume down", "Press mute", "Press Power", "Press A/B switch", "Press memory up", "Press memory down", "Press add", "Press delete", "Press f1", "Press f2", and "Press f3".

If the audio system key 66 is pressed, the program continues with a "Remote Amplifier?" prompt. If the soft-key "Yes" is pressed, the "Press any key" prompt is given. Following the pressing of a key, the following prompts are made: "Press power","Press volume up", "Press volume down", "Press CD (source)", "Press tuner (source)", "Press phono (source)", "Press tape (source)", "Press aux (source)", "Press mute", "Press balance right", "Press balance left", "Press front", "Press back", "Press graphics band", "Press (+)", and "Press (−)". If the soft-key "No" was pressed instead of "Yes" when the "Remote Amplifier?" prompt was given, the above-listed prompts would have been skipped. Regardless, after the Remote Amplifier sequence, a "Remote Tuner?" prompt is made. If "Yes" is pressed, after the "Press any key" prompt, the following prompts are made"Press digit 0", "Press digit 1" . . . "Press digit 9", "Press power", "Press AM/FM", "Press scan >", "Press scan<", "Press enter" "Press memory", "Press f1", and "Press f2". Of course, if the "No" soft-key was pressed after the "Remote Tuner?" prompt was given, the above-listed prompts would have been skipped.

Following the tuner prompts, a "CD player?" prompt is made. Only if an affirmative response is given, the "Press any key" prompt is made. After capture of the system type, the following prompts are given: "Press digit 0", "Press digit 1", . . . "Press digit 9", "Press power", "Press play/replay", "press stop", "Press search >>", "Press search <<", "Press pause", "Press next", "Press previous", "Press time remaining", "Press review", "Press scan", "Press store", "Press clear", "Press select", "Press repeat", and "Press A/B loop". Following the CD player prompts, the "Tape Player?" prompt is given. If an affirmative response is given, the following prompts are given after a key is pressed and the system type captured: "Press digit 1", "Press digit 2" . . . "Press digit 9", "Press power", "Press play", "Press pause", "Press fast forward", "Press rewind", "Press record", "Press Dolby on/off", "Press reverse play", "Press index", "Press AMS", "Press f1", and "Press f2".

If the Aux 1 system key is pressed, the system will follow with a "Device type?" prompt. Two soft keys will be labeled "Sat RCVR" and "Vid Disk". The user must then select one of the system keys TV 63, VCR 64 CBL 65, Aux 1 67, or the "soft" system keys Sat RCVR or Vid Disk. The pressing of any other system keys will prompt an error message. If the TV key 63 is pressed, the "Press any key" prompt is made. Following the capture of the remote system type, the prompts follow in the format for the capture of a TV system as aforedescribed. Likewise, if the CBL system key 65 is pressed after the "Press any key" prompt, the prompts follow in the format for the capture of a cable system as aforedescribed. If the VCR key 64 is pressed, the "Press any key" prompt is made as usual. Following that capture, the prompts continue as set forth above with regard to the capture of a VCR except that preferably, the prompts from "Press play" to "press search <<" are deleted (i.e. not prompted or captured).

If the soft "Vid Disk" key is pressed, after the "Press any key" prompt and system type capture, the following prompts are made: "Press digit 0", "Press digit 1" . . . "Press digit 9", "Press power", "Press play", "Press pause", "Press still", "Press slow", "Press index", "Press search >>", and "Press search <<". The control of the video disk functions will thus be available to a user upon pressing the Aux 1 key 67 (or Aux 2 key 68 as the case may be). Finally, if the soft "Sat RCVR" key is pressed, after the usual "Press any key" prompt and system type capture, the following prompts are made: "Press digit 0", "Press digit 1" . . . "Press digit 9", "Press channel up", "Press channel down", "Press alternate channel", "Press enter or 100", "Press volume up", "Press volume down", "Press mute", "Press satellite", "Press clear", "Press east", "Press west", "Press audio tune up", "Press audio tune down", "Press audio BW", and "Press f1".

It will be appreciated that because many of the keys of various systems which can be captured have no equivalent on the provided keyboard 15, a means must be provided to accomplish the function of those keys. Thus, the soft-keys 20 are provided in conjunction with a menu which appears on LCD 70, thereby allowing an additional eight keys to be available at any one time. In addition, where more than eight additional keys are required to complete the entire range of functions, a second menu page may be provided with up to eight more additional functions. The second menu page may be called up by repressing the system key which is in use. Further, it will be appreciated as described above that the user will have the option of scrolling through any of the capture command (prompt) sequences. Thus, after the "Press any key" prompt appears and the system type is captured, two soft key functions labelled "FWD" and "REV" will appear for scrolling in a desired direction. Preferably, even as the new prompt messages appear for capturing the remote unit, the soft keys for scrolling retain their efficacy.

There has been described and illustrated herein, a reconfigurable remote control apparatus and a method for using the same. While particular embodiments of the invention have been described, it is not intended that the invention be limited exactly thereto, as it is intended that the invention be as broad in scope as the art will permit. Thus, those skilled in the art will recognize that while the invention was described in terms of particular circuitry, other microprocessors and related circuitry could be provided to accomplish the functions described. For example, if a more powerful microprocessor having its own memory were provided, the RAM and/or ROM of the preferred embodiment could be dispensed with as could the bank control logic. In fact, on a large scale, the functions of different components provided could be incorporated into a single or a couple of VLSIs. It will be likewise understood that the programming of the ROM and microprocessor could be varied in a plethora of ways while accomplishing the same or similar results. Therefore, it will be apparent to those skilled in the art that other changes and modifications may be made to the invention as described in the specification without departing from the spirit and scope of the invention as so claimed.

I claim:

1. A method for compressing formatted code obtained from a remote control means, wherein said formatted code includes at least information regarding pause times between pulses output by said remote control means, comprising:
   (a) determining for said formatted code all different pause time information represented in said formatted code and arranging said different pause time information as elements of a first array, each element having a representative element number;
   (b) generating a second array with second array elements from said obtained code and said first array element numbers, wherein said second array elements are comprised of at least two nibbles, each nibble representing an element number of said first array, wherein,
   said second array further represents the obtained formatted code.

2. A method for compressing formatted code according to claim 1, wherein:
   said formatted code includes code for a plurality of keys of a remote control means.

3. A method for compressing formatted code according to claim 1, further comprising:
   (c) determining if one of a repeat code and an entire code repeat occurs in said formatted code; and
   (d) storing data representative of at least the occurrence of one of a repeat code and an entire code repeat.

4. A method for compressing formatted code obtained from a remote control means, wherein said formatted code includes at least information regarding pause times between pulses output by said remote control means, comprising:
   (a) determining for said formatted code all different pause time information represented in said formatted code and arranging said different pause time information as elements of a first array, each element having a representative element number;
   (b) generating a second array with second array elements having representative second array element numbers from said obtained code and said first array element numbers, wherein said second array elements are comprised of at least two nibbles, each nibble representing an element number of said first array, said second array representing all groups of two of pause time information of said formatted code which appear together in said formatted code; and
   (c) generating a third array with third array elements from said obtained code and said second array element numbers, wherein said third array elements are comprised of at least two nibbles, each nibble representing an element number of said second array, wherein
   said third array further represents the obtained formatted code.

5. A method for compressing formatted code according to claim 4, wherein:
   said formatted code includes code for a plurality of keys of a remote control means.

6. A method for compressing formatted code according to claim 4, further comprising:
   (d) determining if one of a repeat code and an entire code repeat occurs in said formatted code; and
   (e) storing data representative of at least the occurrence of one of a repeat code and an entire code repeat.

7. A method for compressing formatted code obtained from a remote control means, wherein said formatted code includes at least information regarding burst lengths and pause lengths between bursts output by said remote control means, comprising:
   (a) determining for said formatted code all different burst length and pause length information represented in said formatted code and arranging said different burst and pause length information as elements of a first array, each element having a representative element number;
   (b) generating a second array with second array elements from said obtained code and said first array element numbers, wherein said second array elements are comprised of at least two nibbles, each nibble representing an element number of said first array, wherein said second array further represents the obtained formatted code.

8. A method for compressing formatted code according to claim 7, wherein:
   said formatted code includes code for a plurality of keys of a remote control means.

9. A method for compressing formatted code according to claim 7, further comprising:
   (c) determining if one of a repeat code and an entire code repeat occurs in said formatted code; and
   (d) storing data representative of at least the occurrence of one of a repeat code and an entire code repeat.

10. A method for compressing formatted code according to claim 9, wherein said bursts output by said remote control means are at a particular frequency, further comprising:

(e) storing data representative of said frequency.

11. A method for compressing formatted code obtained from a remote control means, wherein said formatted code includes at least information regarding burst lengths and pause lengths between bursts output by said remote control means, comprising:

(a) determining for said formatted code all different burst length and pause length information represented in said formatted code and arranging said different burst and pause length information as elements of a first array, each element having a representative element number;

(b) generating a second array with second array elements having representative second array element numbers from said obtained code and said first array element numbers, wherein said second array elements are comprised of at least two nibbles, each nibble representing an element number of said first array, said second array representing information of all burst length and pause length couples of said formatted code which appear together in said formatted code; and (c) generating a third array with third array elements from said obtained code and said second array element numbers, wherein said third array elements are comprised of at least two nibbles, each nibble representing an element number of said second array, wherein said third array further represents the obtained formatted code.

12. A method for compressing formatted code according to claim 11, wherein:

said formatted code includes code for a plurality of keys of a remote control means.

13. A method for compressing formatted code according to claim 11, further comprising:

(d) determining if one of a repeat code and an entire code repeat occurs in said formatted code; and (e) storing data representative of at least the occurrence of one of a repeat code and an entire code repeat.

14. A method for compressing formatted code according to claim 13, wherein said bursts output by said remote control means are at a particular frequency, further comprising:

(f) storing data representative of said frequency.

* * * * *